(12) United States Patent
Holt et al.

(10) Patent No.: US 7,245,118 B2
(45) Date of Patent: Jul. 17, 2007

(54) TEST HEAD MANIPULATOR

(75) Inventors: Alyn R. Holt, Cherry Hill, NJ (US); Richard C. Powell, Jr., Oaklyn, NJ (US); I. Marvin Weilerstein, Jenkintown, PA (US)

(73) Assignee: inTest Corporation, Cherry Hill, NJ (US)

( * ) Notice: Subject to any disclaimer, the term of this patent is extended or adjusted under 35 U.S.C. 154(b) by 0 days.

(21) Appl. No.: 10/955,441

(22) Filed: Sep. 30, 2004

(65) Prior Publication Data

US 2005/0052176 A1    Mar. 10, 2005

Related U.S. Application Data

(62) Division of application No. 09/646,072, filed as application No. PCT/US00/00704 on Jan. 12, 2000.

(60) Provisional application No. 60/115,660, filed on Jan. 13, 1999.

(51) Int. Cl.
G01R 31/02    (2006.01)

(52) U.S. Cl. .................................. 324/158.1; 324/758

(58) Field of Classification Search ............ 324/158.1, 324/752, 758, 765; 414/590; 73/866.5
See application file for complete search history.

(56) References Cited

U.S. PATENT DOCUMENTS 4,336,496 A * 6/1982 Schnabl et al. ............. 324/758
4,459,755 A * 7/1984 Gruhler ......................... 33/832
4,715,574 A * 12/1987 Holt et al. ............. 248/297.11
4,943,020 A    7/1990 Beaucoup et al.
5,241,183 A * 8/1993 Kanai et al. ........... 250/453.11
5,241,870 A    9/1993 Holt
5,440,943 A * 8/1995 Holt et al. ................. 74/89.23
5,459,396 A * 10/1995 Asar ....................... 324/158.1
5,606,262 A    2/1997 Montalbano et al.
5,818,219 A    10/1998 Hama et al.
5,912,555 A * 6/1999 Akaike et al. ........... 324/158.1
5,913,233 A * 6/1999 Park et al. ....................... 73/7
5,931,048 A * 8/1999 Slocum et al. ........... 74/490.07
6,034,524 A * 3/2000 Barringer et al. ........ 324/158.1
6,762,599 B1 * 7/2004 Miller ..................... 324/158.1

FOREIGN PATENT DOCUMENTS

WO    WO 96/26446    8/1996

OTHER PUBLICATIONS

International Search Report dated Oct. 6, 2000 for PCT/US00/00704, attached herewith.

* cited by examiner

*Primary Examiner*—Paresh Patel
(74) *Attorney, Agent, or Firm*—RatnerPrestia

(57) ABSTRACT

A system is useful for positioning a load, such as a test head. The system includes an arm which supports the load and which moves along a first vertical axis. The system also includes a rotation unit for rotating the first vertical axis about a second vertical axis spaced apart from the first vertical axis.

10 Claims, 43 Drawing Sheets

TEST HEAD MANIPULATOR

This application is a divisional of application Ser. No. 09/646,072, filed Dec. 7, 2000, which is a 371 of PCT/US00/00704, filed Jan. 12, 2000 which claims the benefit of 60/115,660, filed Jan. 13, 1999.

FIELD OF THE INVENTION

The present invention relates to the field of art of electronic test head positioners.

BACKGROUND OF THE INVENTION

In the automatic testing of integrated circuits (IC) and other electronic devices, special device handlers have been used which bring the device to the proper temperature and places the device to be tested in position. The electronic testing itself is provided by a large and expensive automatic testing system which includes a test head which has been required to connect to and dock with the device handler. The Device Under Test (DUT) requires precision, high speed signals for effective testing; accordingly, the electronic circuits must be located as close as possible to the DUT. This causes the test head to be extremely heavy.

Test head positioner systems may be used to position the test head with is respect to the device handler. When the test head is accurately in position with respect to the device handler, the test head and the device handler are said to be aligned. When the test head and device handler are aligned, the fragile test head and device handler electrical connectors can be brought together (i.e., docked), enabling the transfer of test signals between the test head and the device handler. Prior to docking, the fragile test head and device handler electrical connectors must be precisely aligned to avoid damaging the fragile electrical connectors.

A test head positioner system may also be referred to as a test head positioner or a test head manipulator. This technology is described, for example, in the inTEST Handbook, inTEST Corporation. This technology is also described, for example, in U.S. Pat. Nos. 5,608,334, 5,450,766, 5,030,869, 4,893,074 and 4,715,574 which are all incorporated by reference for their teachings in the field of test head positioner systems.

For purposes of this explanation, a device under test (DUT) is the present device (IC) undergoing test. A test station apparatus (TSA) refers collectively to wafer probers, device handlers and manual test stations.

To be consistent with descriptions of test head positioner systems in the prior art, the coordinate system 100 illustrated in FIG. 1 is used in which:
  Y=vertical, up-down axis 102
  X=horizontal, side-to-side or left-right axis 104
  Z=horizontal, in-out axis 106.

When viewed from the front of the manipulator, this forms the Cartesian coordinate system.
Rotations about the axes are designated as follows:
  Theta Y=rotation about the Y axis (hereinafter referred to as "swing") 108
  Theta Z=rotation about in-out axis (hereafter referred to as "roll" or "twist") 110
  Theta X=rotation about X axis (hereinafter referred to as "tumble" or "pitch") 112

A reference model for a test floor 200 is shown in plan view in FIG. 2. As shown, Main Test Equipment Cabinet (Tester Cabinet) 202, a TSA 204, a manipulator 206, and a test head 208 are included.

FIG. 3 shows a rectangular box-shaped test head 300 oriented such that its top 302 and bottom 304 surfaces are parallel with the X-Z plane, the sides 308 are parallel with the Y-Z plane, and the front and rear 306 are parallel with the X-Y plane.

The test head includes a test interface on one surface. The test interface typically holds a test interface board, which in addition to other functions, provides connection points to the test apparatus in the prober, handler, or manual test station. The surface having the test interface is hereinafter called the "interface surface" (IS) 310. The IS defines both a plane and a direction; the direction is described by a vector normal to the IS plane and pointing away from the test head. FIG. 3 shows the IS 310 in the horizontal plane with upwards direction. In use, the orientation of the test head will change as it is docked with different types of equipment. Accordingly, both the plane and the direction of the IS 310 will also change.

It is helpful to designate test head dimensions with respect to the interface surface. With the orientation shown in FIG. 3 (IS facing up), the following definitions may be used:
  T=test head thickness=dimension in the up-down direction 312.
  W=test head width=dimension in the side-to-side direction 314.
  L=test head length=dimension in the in-out direction 316.

In use, the test head may be brought upwards to contact the DUT as in a device handler. In this case, the interface surface is facing up (IS UP).

Another alternative is that the test head may be brought downwards to contact the device as in a prober. In this case, the interface surface is facing down (IS DOWN).

Thirdly, both the DUT and the IS may be orientated in a vertical plane (IS vertical).

Fourthly, both the DUT and the IS may be oriented at any angle between the IS up and IS down.

As the test head is moved from one apparatus to another, it is clear that the test head must be rotated among IS UP, IS DOWN, and IS Vertical positions. Depending upon the manipulator, this may be effected by rotation in either the tumble (pitch) or roll (twist) coordinates.

The test head is connected to the test cabinet by a large, thick bundle of cables. The cables, size, weight and resistance to flexing and twisting all interfere with and constrain test head motion. Test head motion is desirably performed in a manner to protect the cable from several factors as described, for example in U.S. Pat. No. 5,608,334.

Many test heads, particularly large ones, are attached to the manipulator using a "cable-pivot" apparatus. In the cable-pivot mode, the cable is brought from the test head at the center of rotation and parallel with the axis of rotation (normally the roll or twist axis). This is described, for example, in U.S. Pat. Nos. 5,030,869, 5,450,766 and 5,608,334.

It is desirable to support the cable in a manner to minimize interference with test head motion. It is also desirable to protect the cable from stress. For this purpose, a telescopic cable support mechanism 400, as shown in FIG. 4, may be used.

Such a mechanism is described, for example, in U.S. Pat. No. 4,893,074.

Referring to FIG. 5A, a conventional test head positioner system 500 is shown.

Test head positioner system 500, may include, for example, main arm 511 and projected cradle assembly 520 which is described in U.S. Pat. No. 5,450,766.

As shown in FIG. 5, the main arm 511 is coupled to linear guide rail 510. Main arm 511 moves vertically in either direction along linear guide rail 510. A lock mechanism (not shown) allows the position of main arm 511 to be fixed relative to linear guide rail 510. Positioner assembly 501 is adapted to ride vertically on linear guide rail 510 by a counter weight assembly (not shown) which moves vertically in either direction within the rear section of column 545. The counter weight assembly enables the test head to be moved vertically with minimal force. In addition, the test head is mounted according to its center of gravity. Cables 512 extend from test cabinet 514 and into the rear section of test head 502.

Cradle assembly 520 is coupled to main arm 511. Cradle assembly 520 has a front "C" shaped section which is coupled to test head 502, such that test head 502 may pitch about an axis passing through its center of gravity. Operation and details regarding cradle assembly 520 are fully explained in U.S. Pat. No. 5,450,766 and are not repeated here.

Column 545 rests upon translation table 521. Translation table includes side-to-side plate 522, in-out plate 524, turntable 526 and base 530. Column 545 is coupled to side-to-side plate 522. Guides 523 in side-to-side plate 522 and the rails (not shown) of in-out plate 524 couple side-to-side plate 522 to in-out plate 524. Guides 525 of in-out plate 524 are coupled to the rails 527 of turntable 526. Turntable 526 is, in turn, coupled to base 530 with a bearing surface (not shown). Column 545 may be repositioned as desired along the x and z-axes by moving side-to-side table 522 and in-out table 524, respectively. Column 545 may also be rotated about the y-axis by rotating turntable 526 about its coupling with base 530. Of course, as column 545 is moved along these axes, test head 502 is repositioned.

FIG. 5B is similar to FIG. 5A except for the relative positions of the parts associated with translation table 521. In particular, the turntable 526 is between column 545 and side-to-side plate 522. In addition, guides 525 of in-out plate 524 are directly coupled to base 530 at rails 531. In all other aspects, FIGS. 5A and 5B are similar. Therefore, the remaining details of FIG. 5B are not repeated here.

Other combinations of horizontal motions built into the manipulator base are possible. If such motions are not built into the base, they are typically provided in the arm assembly. For example the inTEST Corp. in2 manipulator first described in U.S. Pat. No. 4,527,942 provides no horizontal motions in its base; an articulating arm assembly provides all horizontal motion. Further, manipulators are known which have bases that provide only swing rotation motion, such as the system described in U.S. Pat. No. 5,606,262, assigned to Teradyne.

Several manipulators provide two motions in their bases. A manipulator manufactured by Teradyne and described in U.S. Pat. No. 5,931,048 and 5,5,949,002 provides swing rotation and side-to-side motion in its base with the swing mechanism at the bottom; in-out motion in this manipulator is provided in the arm and cradle assemblies. A further manipulator manufactured by Reid-Ashman MFG, Inc., provides side-to-side and in-out motion in the base with swing provided by rotation the arm about a shaft attached to the column.

A manipulator manufactured by Schulmberger provides side-to-side motion and swing rotation motion in its base with the swing mechanism on top of the side-to-side mechanism. In-out and roll motions are provided in the arm assembly. This manipulator is unique in that the cable passes from the cabinet, through the center of the column above the center of rotation, to terminate at the test head. Also unique to this manipulator is a spring mechanism that serves as a counter balance which was first described in U.S. Pat. Nos. 4,943,020 and 4,973,015, both assigned to Schulmberger.

Finally, a further manipulator, also manufactured by Reid-Ashman MFG, Inc., provides all three motions in its base with the swing rotation mechanism at the bottom.

In operation, the test head 502 is manipulated towards the docking position, using in part the translation table described above. When the test head is within a distance of 1 cm to 2 cm to its ultimate docked position, an alignment apparatus starts to engage. At this point, a docking actuator is engaged which draws the test head into the final aligned test position and into engagement with the DUT test fixture and/or probe card. As the test head is drawn into position, the alignment apparatus, such as tapered pins engaging mating holes, reduces any initial error to within a small allowable tolerance. During dock actuation, the test head is desirably free to move in any combination of axes is and rotations to assure final alignment and parallelization. Thus, all axes should be free during dock actuation.

Similarly, when undocking, all axes should be free as the dock actuation process is reversed. Now the dock mechanism pushes the test head away from engagement with the test socket/probing assembly apparatus. Once undocked, selected axes can be secured, if so desired, to allow the test head to be moved away from the prober/handler, using only one motion axis.

Recent advances in the semiconductor industry have had the following effects:

1. DUTs have become more complex; the number of transistors per device has grown steadily from a few thousand to a few million.
2. DUTs have become increasingly complex mixtures of digital circuitry, analog circuitry, and mixed signal circuitry.
3. The number of I/O, power supply and signal ground reference pins per device has grown to several hundreds from less than one hundred.
4. DUT clock rates have gone from 10's of MHz to at least 1 GHz.
5. Data, Address and Control signals are accordingly in at least the 100's of Mbps range.
6. Per pin frequency bandwidth requirements are at least in the 10's of GHz range.

As a result, the following test system design changes have become desirable:

1. More, faster and more complex pin-electronics circuits in the test head.
2. Greater power dissipation per pin circuit in the test head can be expected due to the higher switching rates.
3. Water cooling systems with circulating water have been added to the test heads, increasing their weight and necessitating flexible plumbing to be included in the test head cable.
4. More power supply and ground conductors of heavier gauges are in the interconnecting test head cable.
5. Moving circuitry from the system cabinet to the test head to reduce the amount of signal wiring and associated delays in the cable.

These factors have driven the size and weight of test heads to increase significantly while at the same time requiring:

1. The demand that the test head be brought into close proximity to the DUT is increasingly important.
2. The cable from test head to tester cabinet be kept as short as possible while at the same time it has become thicker and stiffer.

Thus, test heads and their associated cables have become significantly larger and heavier.

SUMMARY OF THE INVENTION

A system is useful for positioning a load, such as a test head. The system includes an arm which supports the load and which moves along a first vertical axis. The system also includes a rotation unit for rotating the first vertical axis about a second vertical axis spaced apart from the first vertical axis. The system may also include a cable support, which moves along a third vertical axis and which supports a cable coupled to the load.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
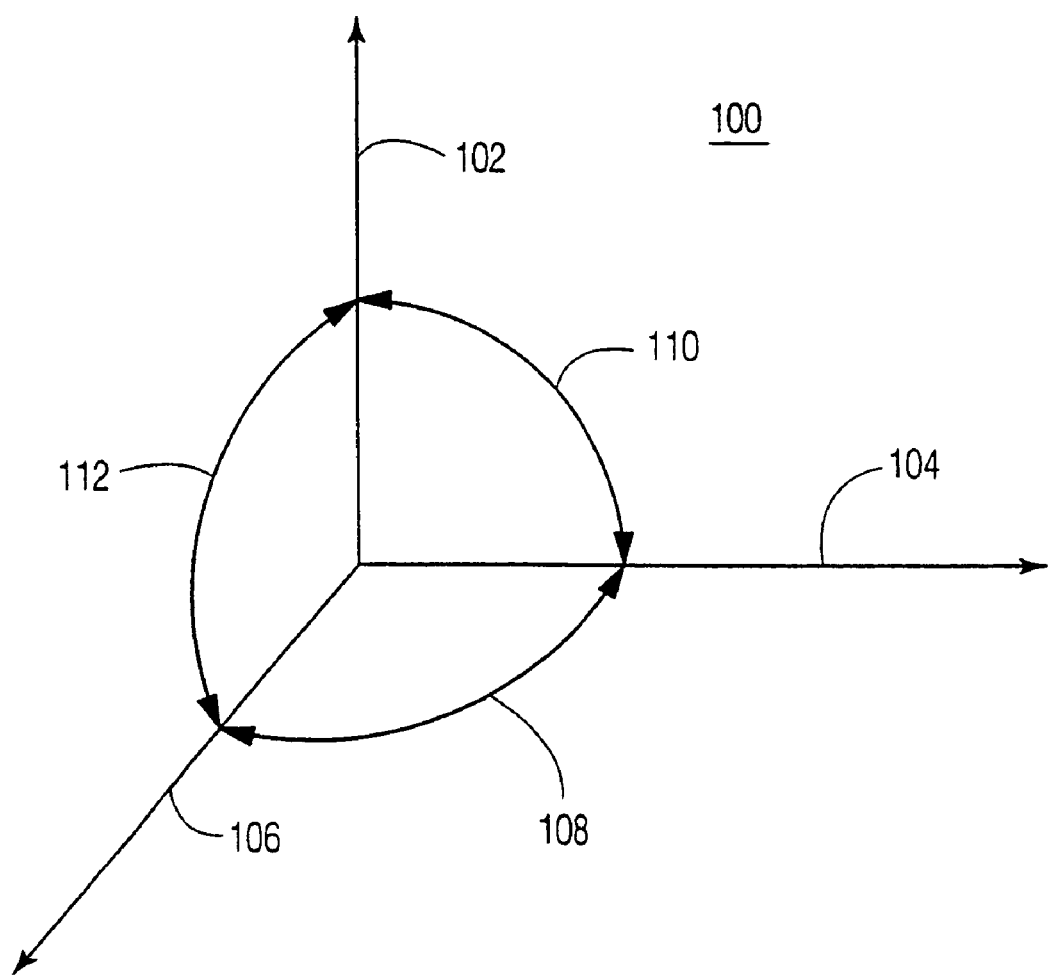
FIG. 1 is an illustration of the test head manipulator coordinate system.
Figure 2:
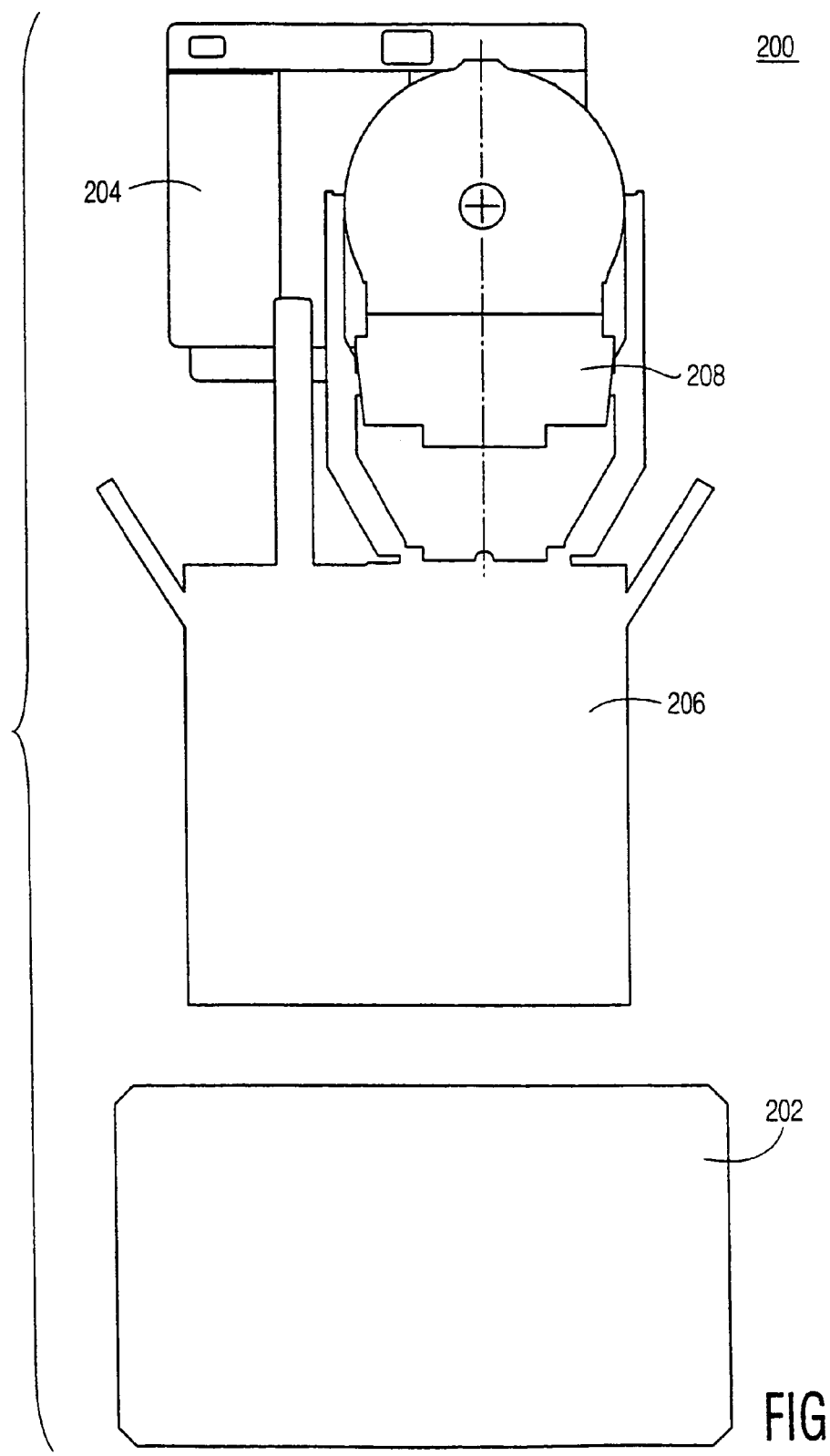
FIG. 2 is a plan view of a test floor layout for a typical test head manipulator system.
Figure 3:
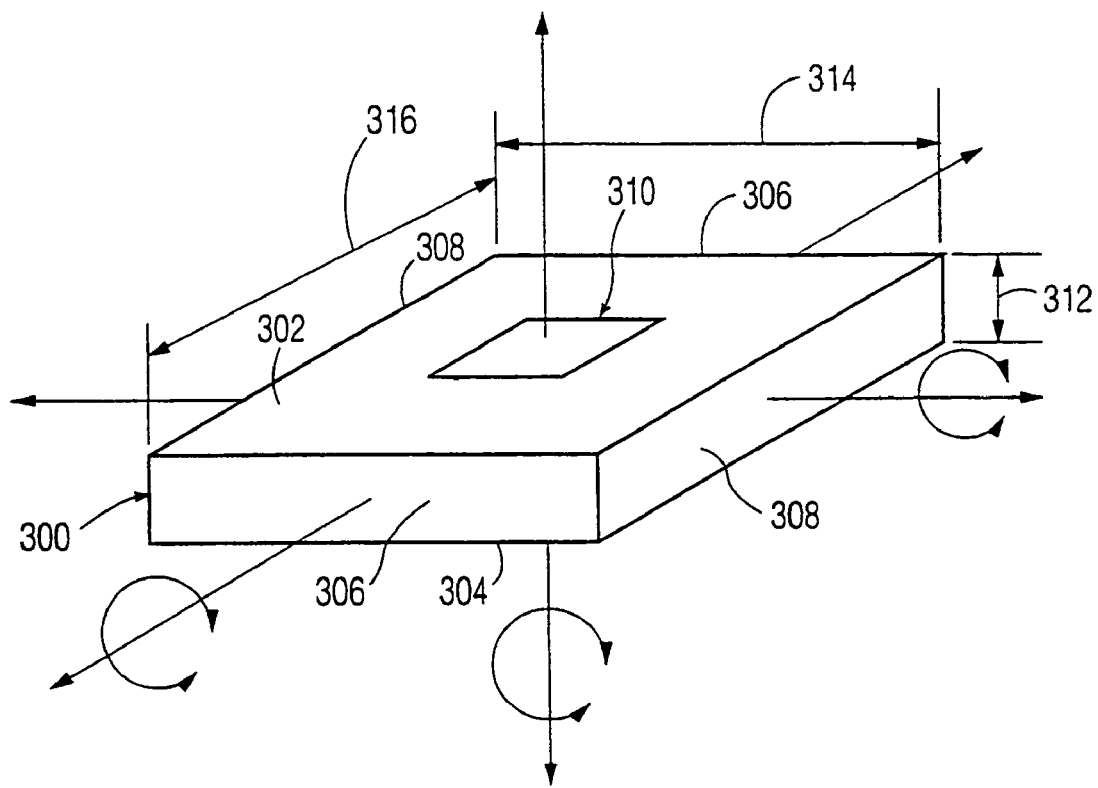
FIG. 3 is an illustration of a test head placed within the coordinate system of FIG. 1.
Figure 4:
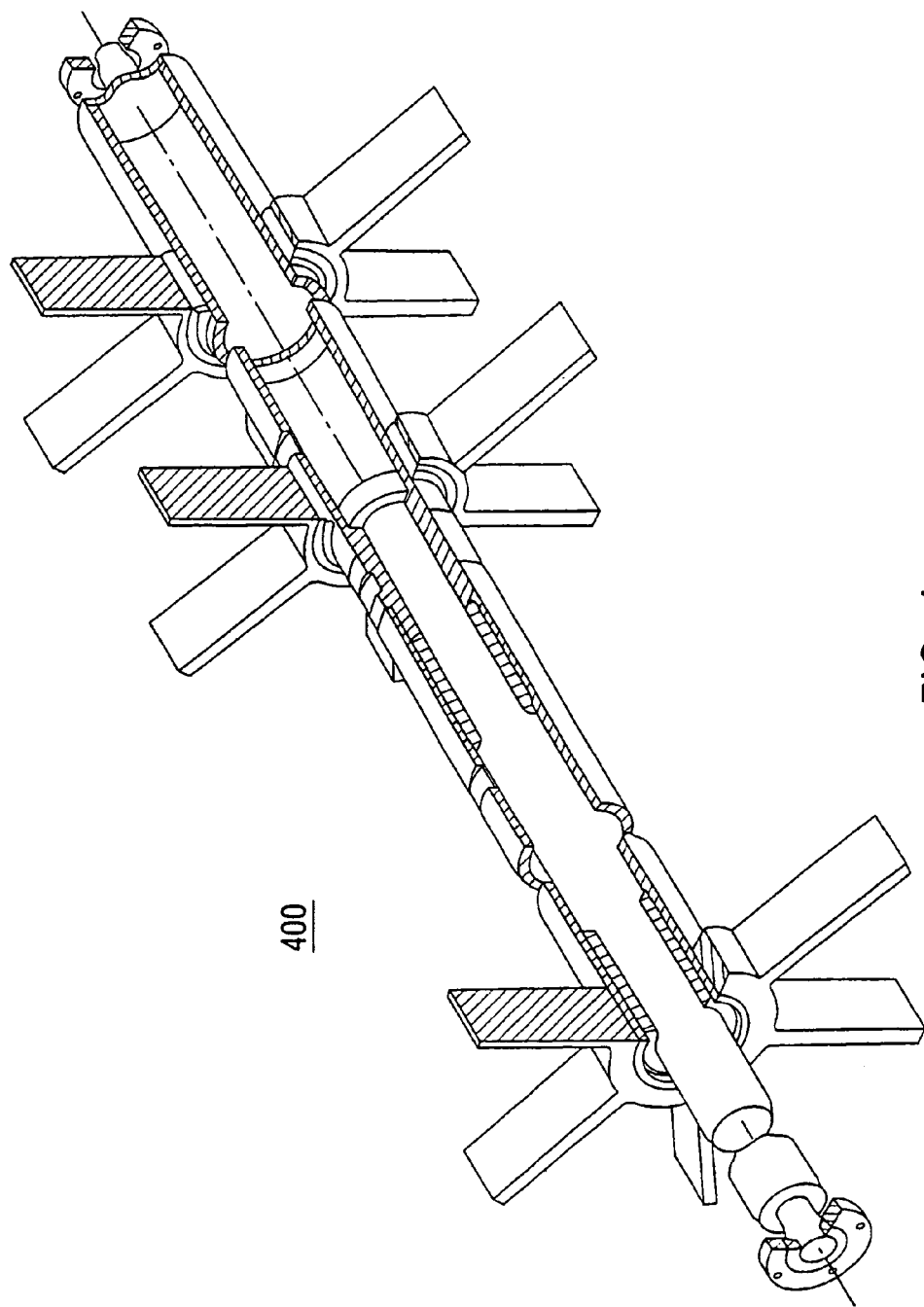
FIG. 4 is a perspective view of a conventional telescopic cable support.
Figure 5A:
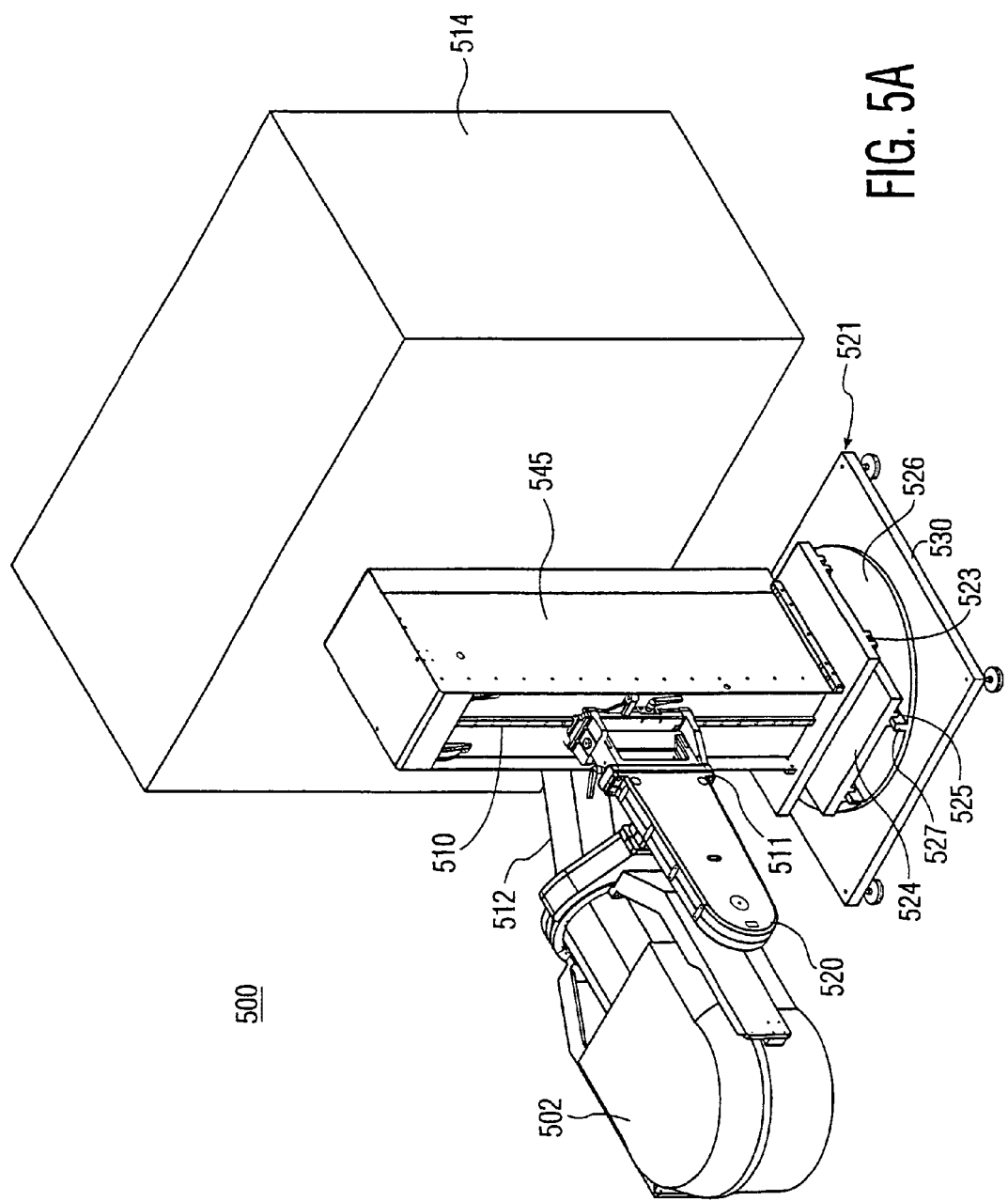
FIGS. 5A and 5B are perspective views of a representative conventional test head manipulator.
Figure 5B:
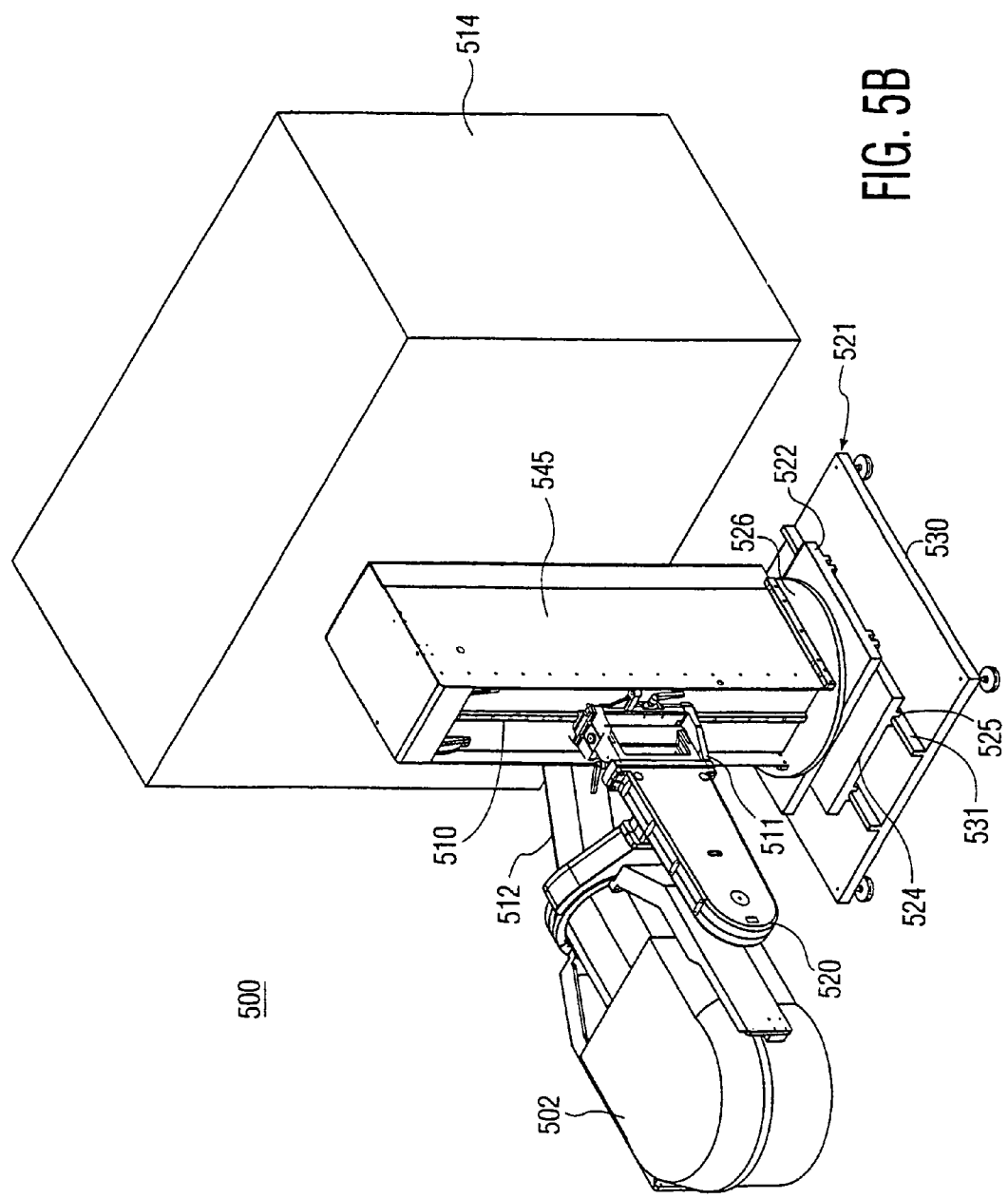
Figure 6:
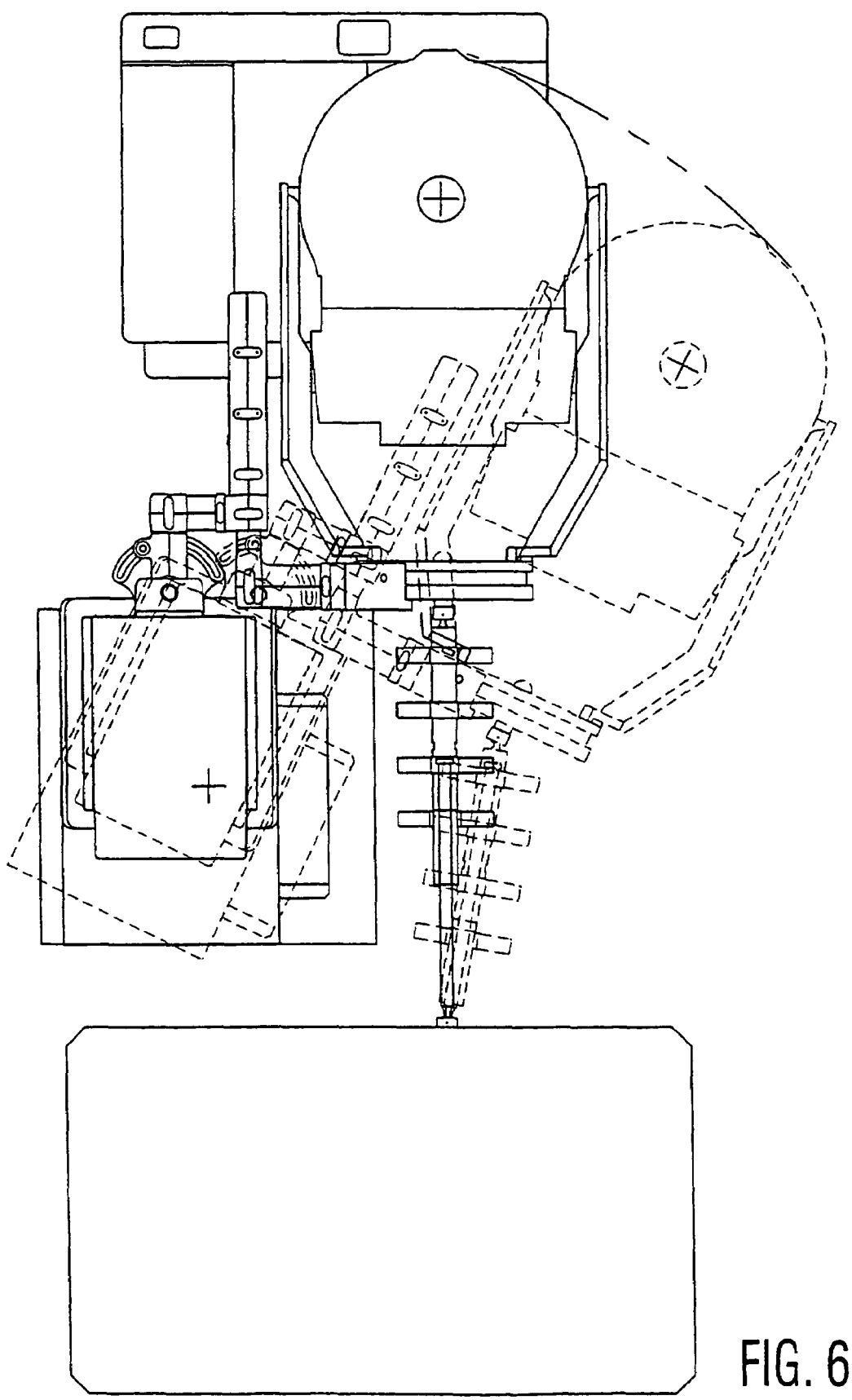
FIG. 6 is a partial top view of a conventional installation of a test head manipulator.
Figure 7A:
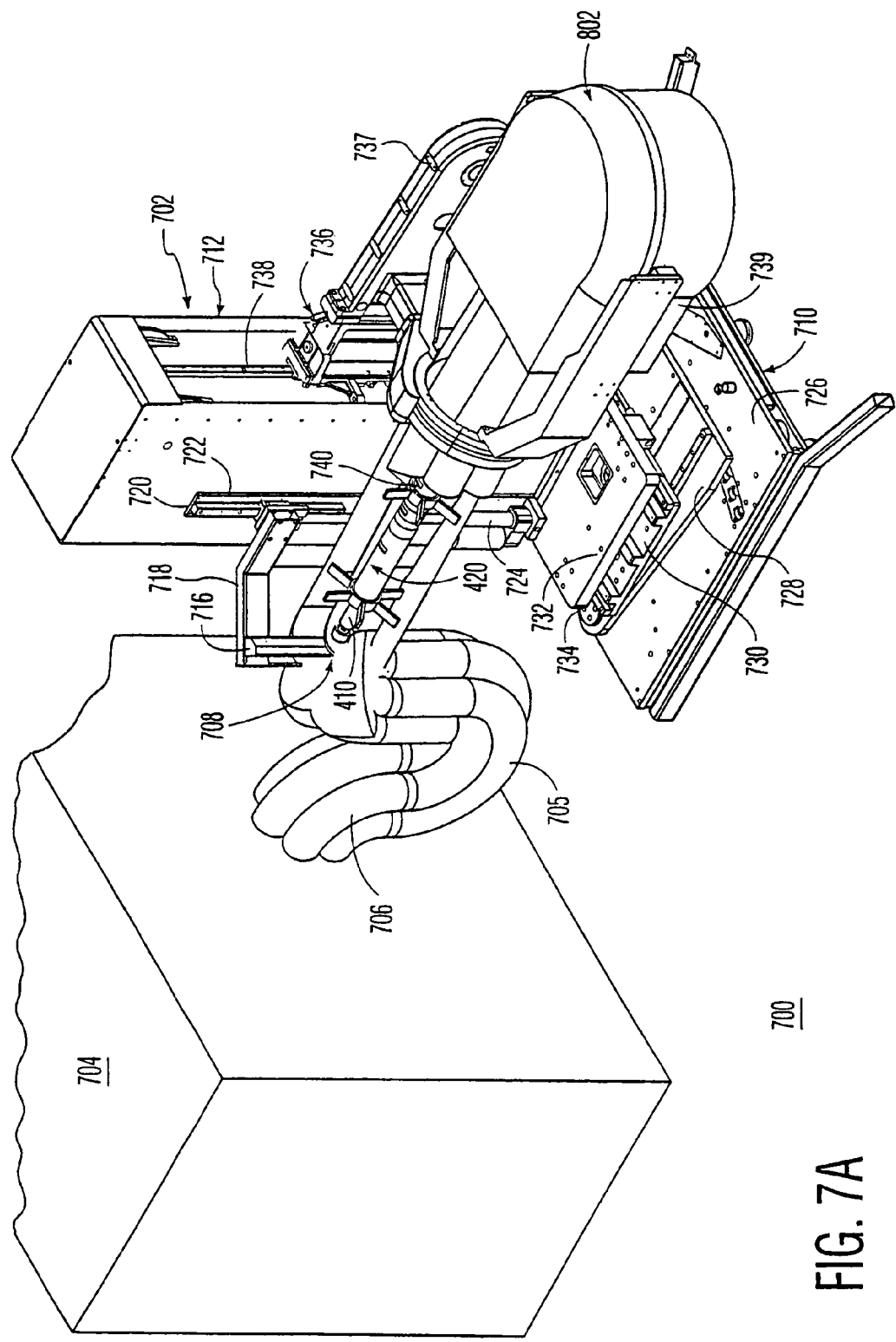
FIGS. 7A and 7B are perspective views of a portion of a test head manipulator according to an exemplary embodiment of the present invention.
Figure 7B:
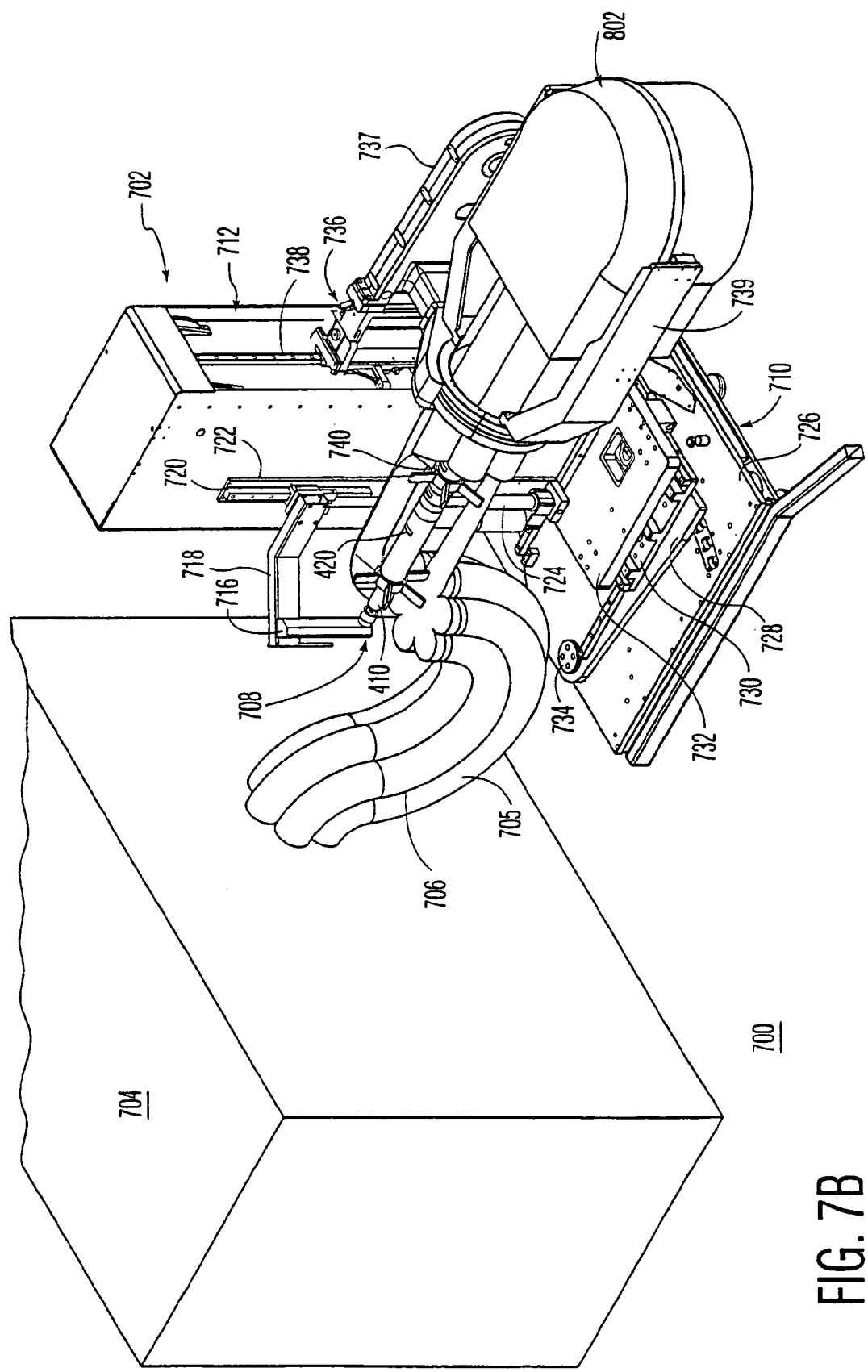

FIGS. 7A and 7B are perspective views of a test head manipulator system 700 constructed in accordance with the present invention. In FIGS. 7A and 7B, test head manipulator system 700 includes manipulator assembly 702 interconnected to main test system cabinet 704 via cables 706. The cables 706 are coupled to the test head 802. Cables 706 may provide control and data signals to/from the cabinet 704. Cables 706 also include power and grounds. Cables 706 may optionally include coolant supply tubes. Cables 706 are supported by telescoping cable support arm 708. Which is shown in FIG. 4 and described fully in U.S. Pat. No. 4,893,074. The telescoping cable support arm piston 410 is connected at one end to mounting block 716; and the telescoping support arm cylinder 420 is connected to cable pivot 740 which in turn is connected to cradle 739 that holds test head 802 (as is more fully described in the '074 patent). From test head 802, cable 706 passes through cable pivot 740 and is disposed along telescoping cable support arm cylinder 420. Between telescoping cable support arm cylinder 420 and the point where it enters/exits cabinet 704, a "service loop" 705 in cable 706 is arranged. Service loop 705 provides sufficient slack in cable 706 to allow test head 802 to be moved throughout its desired motion envelope.

Mounting block 716 is attached to column structure 712 through support arm 718. A linear guide rail 720 is attached to a mounting plate 722 on column structure 712 and provides a mechanism whereby the telescoping cable support arm 708 may move vertically as test head 802 is repositioned vertically. A motor driven linear actuator 724 may be used to provide vertical motion of support arm 718 along linear guide rail 720. As a result, the end of cable support arm 708 may be raised and lowered. Thus, cables 706 may, under operator control, be maintained level or maintained at a substantially constant angle with respect to the horizontal plane as the test head 802 is moved along the vertical axis. In this way, the vertical component of the force exerted on the test head 802 by the cable 706 may be maintained at a substantially constant value, enabling the test head 802 to remain in a freely moving, balanced state.

Column structure 712 is attached to base assembly 710 which provides motion along the X and Z axes in addition to the ability to rotate the entire manipulator assembly 702 about the Y axis at pivot point 734 in both a clockwise and counter-clockwise direction. This latter rotation allows the manipulator assembly 702 to be repositioned away from any TSA so that maintenance may be performed on the prober or test head.

Column structure 712 may be either of fixed height or of variable (telescopic) height.

FIG. 7A shows column 712 moved to the end of the Z-axis that is closest to cabinet 704, and FIG. 7B shows column 712 moved to the opposite end of the Z-axis furthest from cabinet 704. Otherwise, the two figures are the same. It is observed that in FIG. 7A service loop 705 is compact and falls close to the floor; whereas in FIG. 7B service loop 705 is straightened to a degree to accommodate the increased distance between column 712 and cabinet 704. Service loop 705 is not fully straightened in FIG. 713; additional slack remains to allow vertical motion of test head 802. In FIG. 7A, further observe that although the end of telescoping support arm piston 410 is in proximity to cabinet 704, the point where service loop 705 meets telescoping support arm cylinder 420 is substantially above pivot point 734. It is seen that the spacing between pivot point 734 and cabinet 704 is consistent with the space requirements for service loop 705.

Base assembly 710 consists of several sub-plates arranged in a stacked manner so that each sub-plate is coupled to adjacent sub-plates. Specifically, bottom plate assembly 726 is coupled to swing plate assembly 728 which is, in turn, coupled to in-out plate assembly 730, which is in turn coupled to side-to-side plate assembly 732, which is in turn coupled to column structure 712. Details of how test plates are coupled to one another is discussed in detail below.

The test head 802 is attached to main arm 736 through upper arm assembly 737 and cradle 739. The test head acts as a load. A drive system (not shown in this figure) may optionally be attached to column structure 712 and provide a driving force to move main arm 736 in a vertical direction. It is contemplated that as main arm 736 moves in the Y axis along a first vertical axis provided by linear guide rail 738, the various cables supported by cable support arm 708 be moved upward and downward along a second vertical axis provided by linear guide rail 720 as assisted by linear actuator 724.

Figure 8:
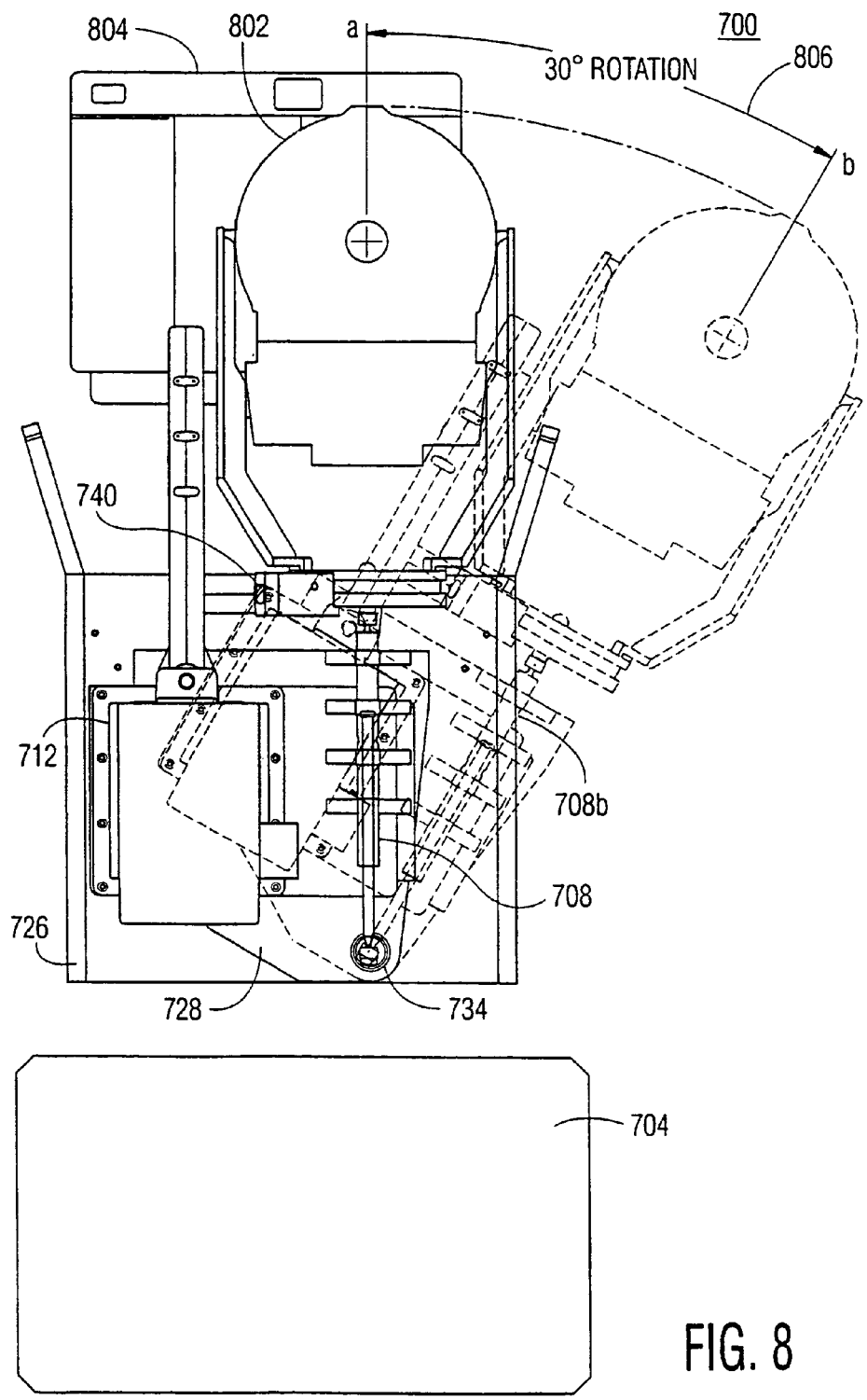
FIG. 8 is a plan view of a test head manipulator of FIG. 7A or 7B.

Referring to FIG. 8, a plan view of the test head manipulator system 700 is shown. In operation, test head 802 is positioned at location "a" above wafer prober 804 in order to test a DUT on the wafer (not shown). As discussed above, in order to perform maintenance on test head 802 or prober 804, it is preferable to swing test head 802 away from prober 804. The inventor accomplishes this by providing a pivot 734 about which pivot plate 728 moves with respect to bottom plate 726. As shown in FIG. 8, pivot point 734 allows column 712 and test head 802 to swing to position "b" away from prober 804. In order to prevent damage to the test interface components, it is preferable to raise the test head 802 away from the test interface before swinging the test head away from prober 804. The angle 806 though which the assembly: swings may be about 30° or any other angle that allows sufficient clearance. It is desirable to limit angle 806 in order to prevent excessive twisting of cable 706 (shown in FIGS. 7A and 713) to minimize the possibility of damage to cable 706. Therefore, it may be ideal for pivot point 734 to be located directly under the point where the cable 706 exits the cabinet 704 as shown in FIGS. 7A and 7B. In the exemplary embodiment of the present invention, however, pivot point 734 is located as close as practically possible directly under the point where cable 706 exits cabinet 704. Depending upon the stiffness of cable 706, service loop 705 will require a distance of between two and three cable thicknesses when the test head is moved to its closest position to cabinet 704. This factor ultimately determines the closest possible spacing between pivot point 734 and cabinet 704.

Referring again to FIG. 8, in the preferred embodiment, the end of cable support 708 is located above pivot point 734 when the column structure 712 is positioned at the center of the X axis and at the center of the Z axis. It should be noted, that as movement of base assembly 710 occurs along the X axis or the Z axis, the end of cable support 708 moves relative to pivot point 734. In any event, as shown in FIG. 8, the length of cable support 708 does not extend or retract during rotation through angle 806, or as the column structure 712 moves along the x or z-axes. As such, motion, wear and fatigue of the cable 706 are reduced. Cable support 708 extends or retracts as test head 802 moves along the y-axis relative to support arm 718, and/or pitches about the z-axis. It is to be noted that this extends the available motion envelope in comparison to the prior art where the end of the cable support is attached to a fixed location, such as the test cabinet.

Figure 9:
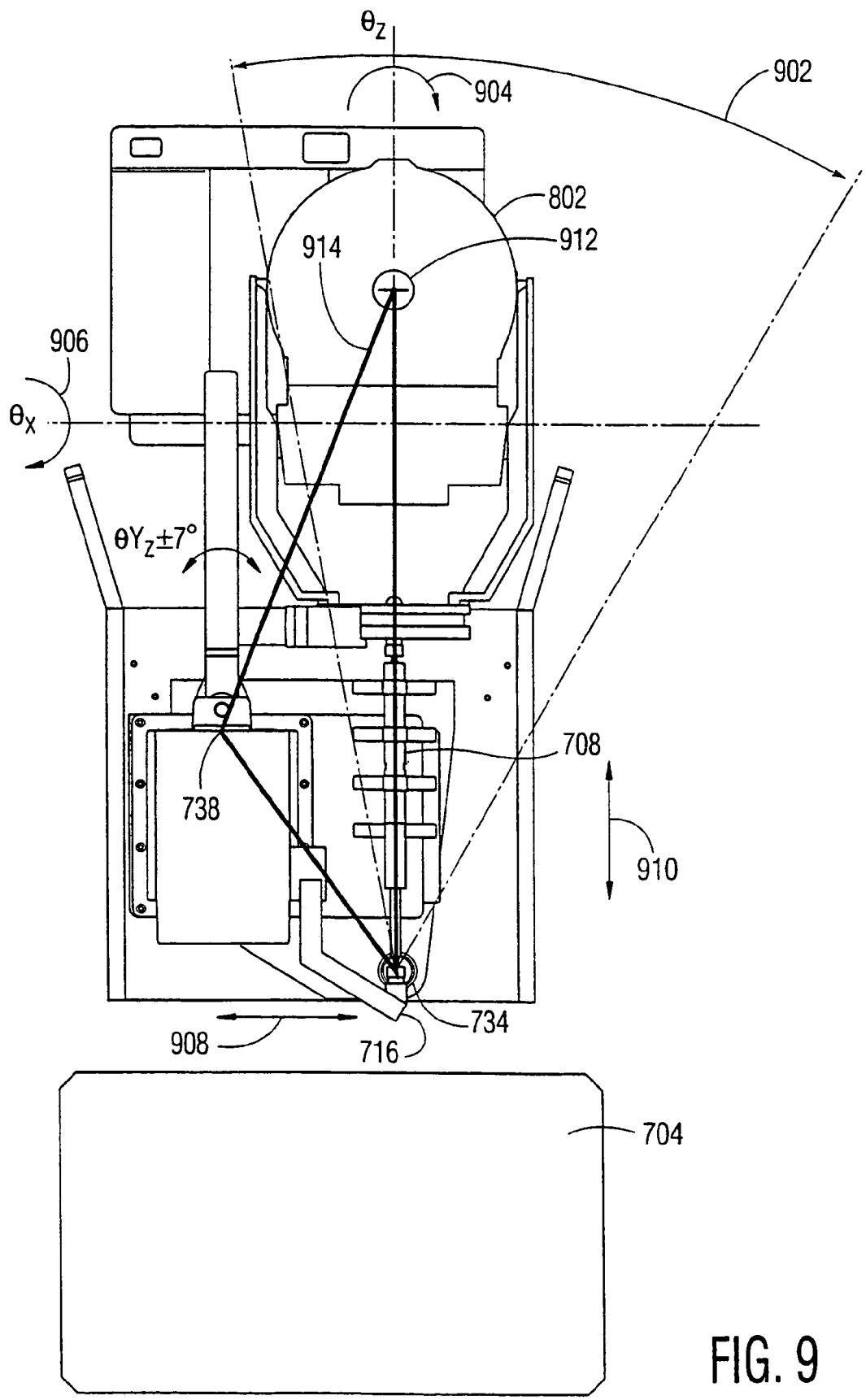
FIG. 9 is a plan view of the test head manipulator of FIG. 7A or 7B showing various degrees of freedom.

Referring to FIG. 9, another plan view of the test head manipulator system 700 is shown which illustrates the degrees of freedom of various parts of the test head manipulator 700. As shown in FIG. 9, the test head 802 and cable support arm 708 may be subject to swing motion about the y-axis by moving in an arc 902 about a second vertical axis centered at pivot point 734. In a preferred embodiment the arc 902 may include a range of angles relative to the position where the test head is docked with the device handler (hereafter, "the docking position"). For example, if the docking position is defined to be 0°, the arc 902 may include angles of about −10° through about +30° from the docking position.

FIG. 9 also shows that test head 802 may rotate about z-axis 904. In an exemplary embodiment, rotation about axis 904 may be about ±95' from the interface surface (IS) vertical position. Test head 802 has a center of gravity (CG) 912. The combination of the vertical axes passing through CG 912, pivot point 734, and linear guide rail 738 form triangle 914. Each of these axes forming the respective vertices of triangle 914.

FIG. 9 shows that test head 802 may be subject to pitch motion about the x-axis. Axis 906 represents the degree of pitch of test head 902. It is contemplated that test head 802 may pitch about the x-axis between about ±4° from a nominal horizontal position depending upon the application.

FIG. 9 shows that test head 802 may move along the x-axis. Axis 908 represents motion of test head manipulator 700 along the x-axis. In an exemplary embodiment, it is contemplated that the x-axis motion is within a range of about 25 cm from one end to the other.

FIG. 9 shows that test head 802 may move along the z-axis. Axis 910 represents motion of test head manipulator 700 along the z-axis. In an exemplary embodiment, it is contemplated that the z-axis motion is within a range of about 50 cm from one end to the other.

Figure 10:
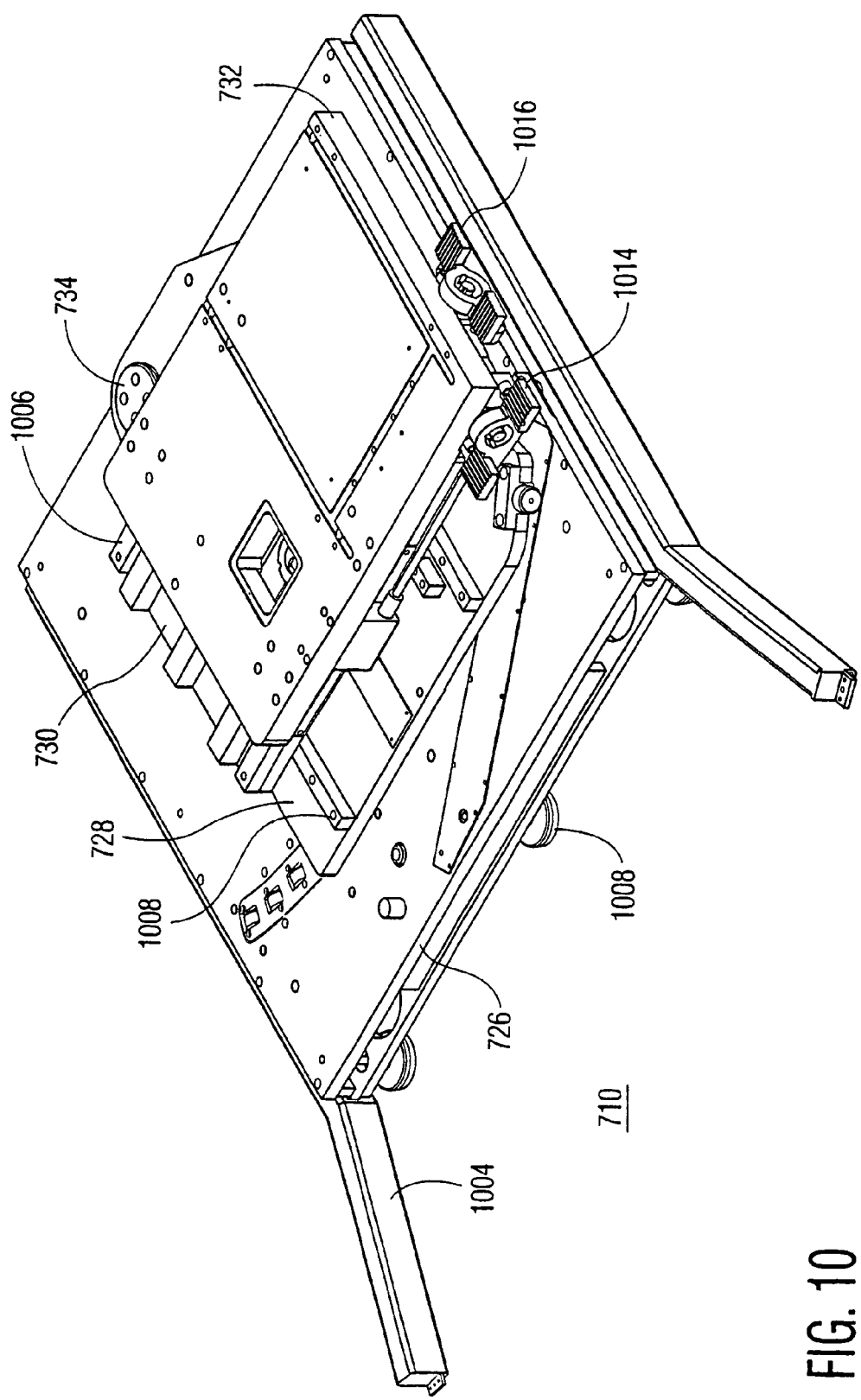
FIG. 10 is a perspective view of the base assembly for the test head manipulator of FIG. 7A or 7B.

Referring to FIG. 10, a perspective view of base assembly 710 is shown. FIGS. 11-19 show various details of base assembly 710. In FIGS. 10 and 11, support legs 1004 are attached to bottom plate assembly 726. Support legs 1004 provide stabilization to counteract the effects of the force exerted at the base assembly 710 by the mass of the test head assembly. Leveling feet (not shown) may be attached to the end of support leg and may be adjusted as necessary. Leveling pads 1000 are also attached to bottom plate assembly 726, using any of several conventional means, to compensate for irregularities in the floor of the test area and to allow the test manipulator 702 to be leveled. In the preferred embodiment, 9 leveling pads 1000 are contemplated although any number of leveling pads 1000 may be used as desired depending on the circumstances. Lock pedals 1014 and 1016 are attached to side-to-side plate 732 to inhibit motion along the x and z-axes, respectively. Details of lock pedals 1014 and 1016 along with their respective mechanisms are described in detail below.

Figure 11A:
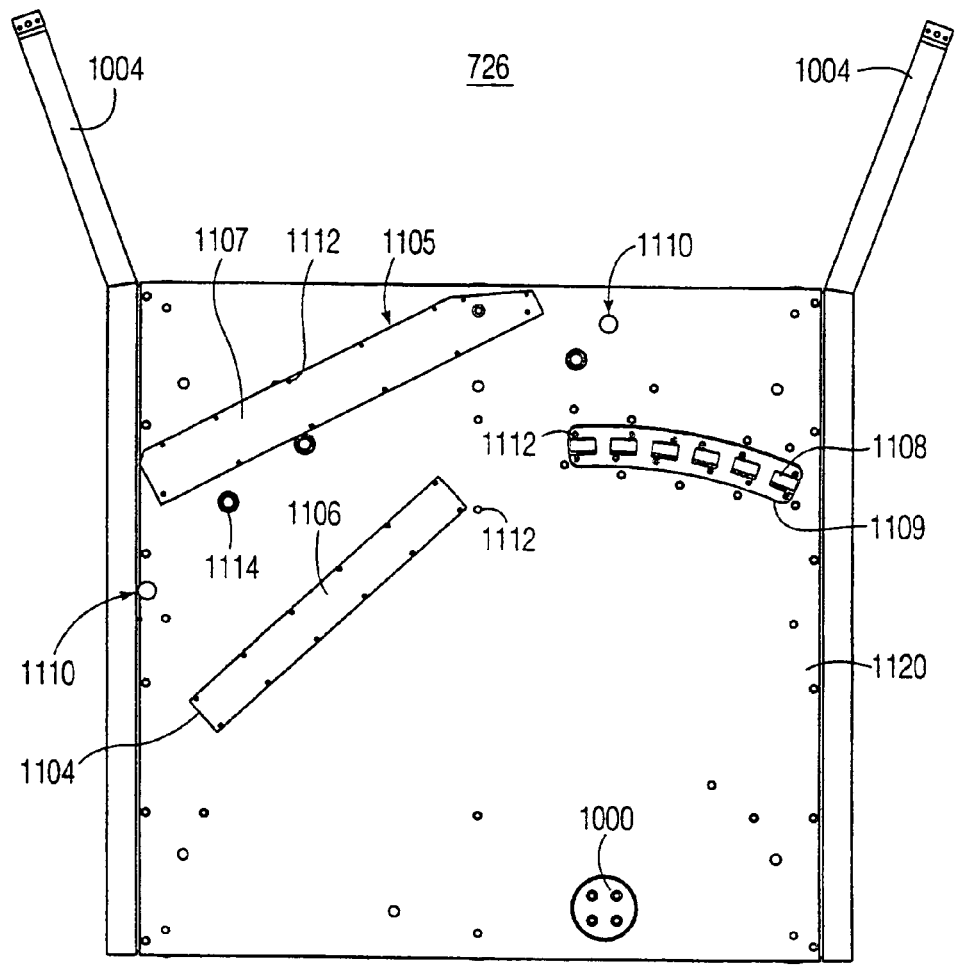
FIGS. 11A-11C are detailed views of the bottom plate of the base assembly of FIG. 10.
Figure 11B:
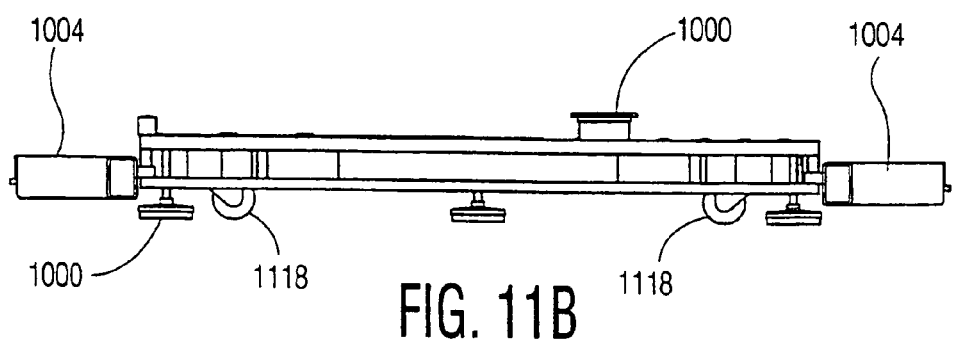
Figure 11C:
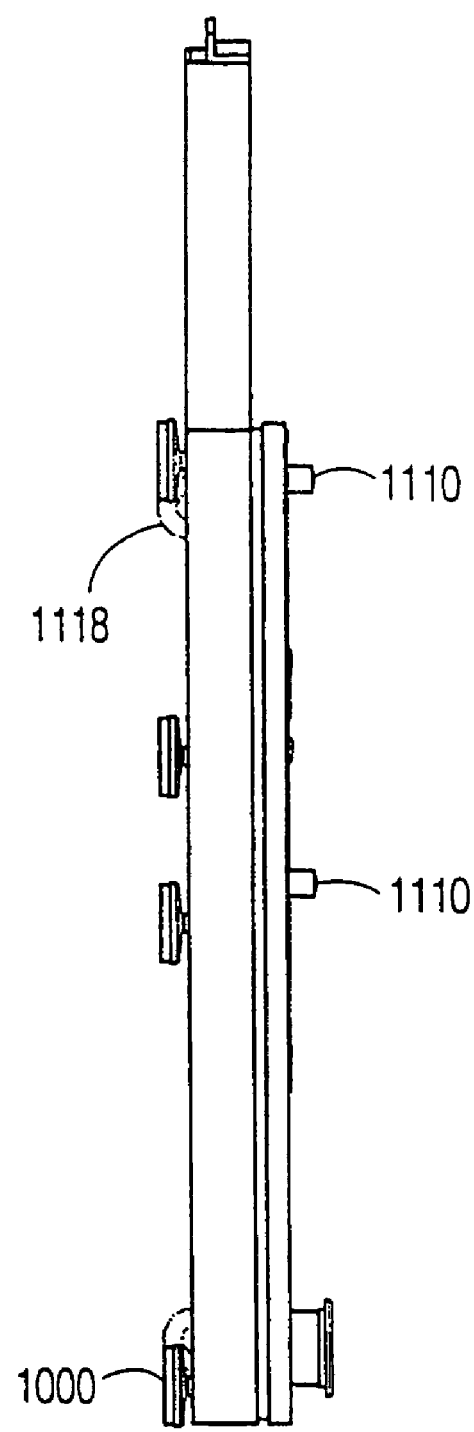

Referring to FIGS. 11A-11C, further details of bottom plate assembly 726 are shown. In FIG. 11A, bearing assembly 1100 is mounted to the top surface of bottom plate 1120. Swing plate assembly 728 (not shown in this figure) is coupled to bearing assembly 1100 and pivots about bearing assembly 1100. Plates 1104, 1105 and rollers 1108 are attached using attaching means 1112 (such as screws) to the top surface of bottom plate 1120 and provide support for swing plate assembly 728. Plates 1104, 1105 are provided so that rollers 1202 (shown in FIG. 12) attached to the bottom surface of swing plate assembly 728 ride on the surface of plates 1104, 1105 as shown by arcs 1106, 1107, respectively, avoiding wear on bottom plate 1120. Plates 1104, 1105 may be made of a durable material such as hardened steel and may be replaced as necessary. Similarly, rollers 1108, of which there are 6 in the preferred embodiment, may be replaced when worn. In the exemplary embodiment, rollers 1108 are mounted on bearing cradle 1109, which is in turn mounted on the top surface of bottom plate 1120.

In order to limit the rotational motion of swing plate assembly 728 relative to bottom plate assembly 726, rubber bumpers 1110 are attached to the top of bottom plate 1120. Rubber bumpers 1110 provide positive end stops for swing plate assembly 728, by edges of swing plate 728 confronting rubber bumpers 1110 mounted to bottom plate 1120. Furthermore, to provide positive detent positions, members 1114, such as cam followers, may be attached to the surface of bottom plate 1120 along the arc of travel 1116 of swing plate assembly 728. In the preferred embodiment, members 1114 provide indexing for swing plate 728 at about 10° counter-clockwise and about 30° clockwise from the operational position as viewed from above. Of course, additional members 1114 may be placed along the arc of travel 1116 to provide a greater or lesser number of positive detents as desired. It is contemplated that two additional members 1114 may be added, each spaced about 10° from one another, thereby providing indexing at about 10° and about 20° clockwise from the operational position.

Referring now to FIG. 11B, casters 1118 are attached to the bottom of bottom plate 1120 in order to allow manipulator assembly 702 to be positioned as desired on the test floor. In the preferred embodiment four casters 1118 are used although a greater number of casters may be used as desired.

Figure 12A:
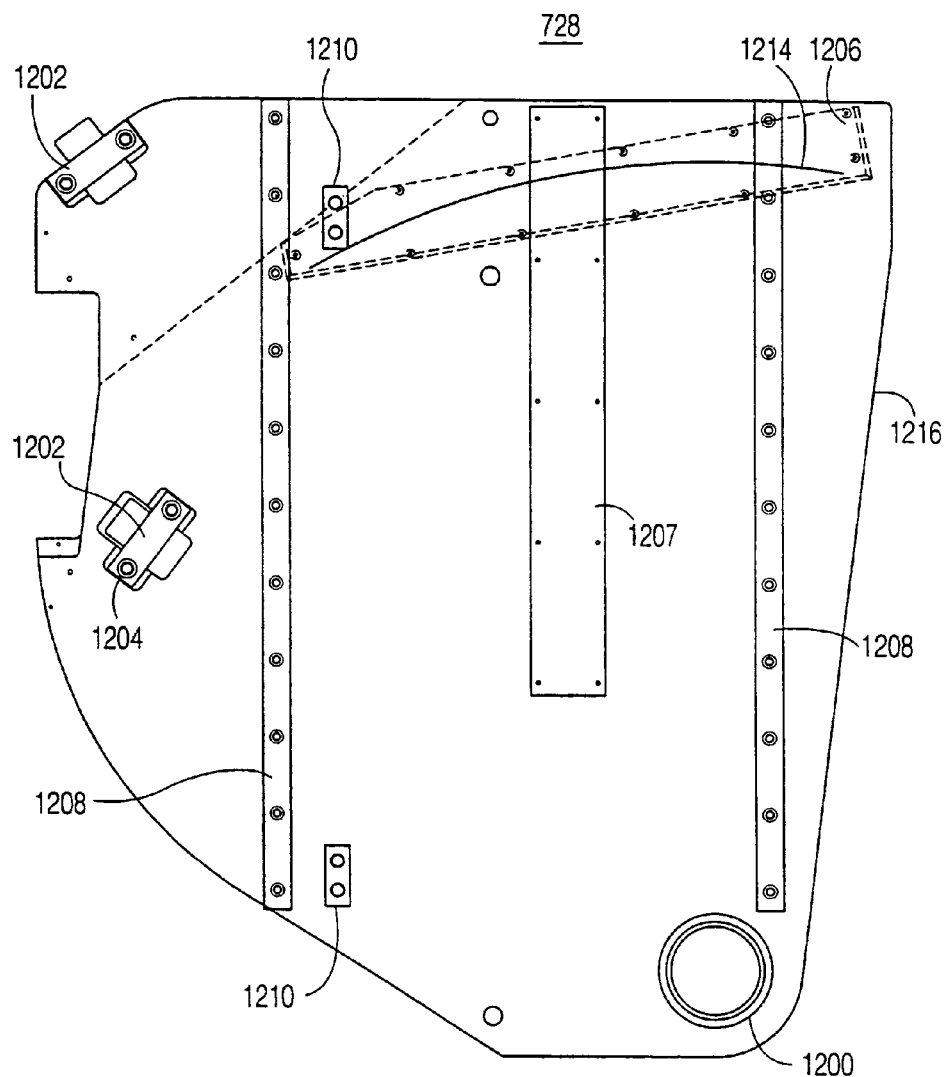
FIGS. 12A-12C are detailed views of the swing plate portion of the base assembly.
Figure 12B:
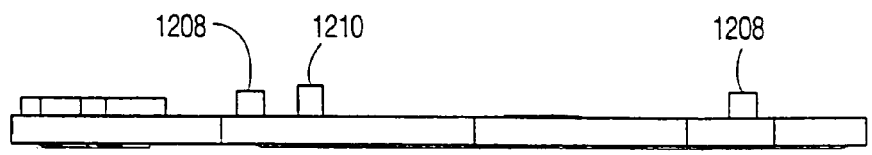
Figure 12C:
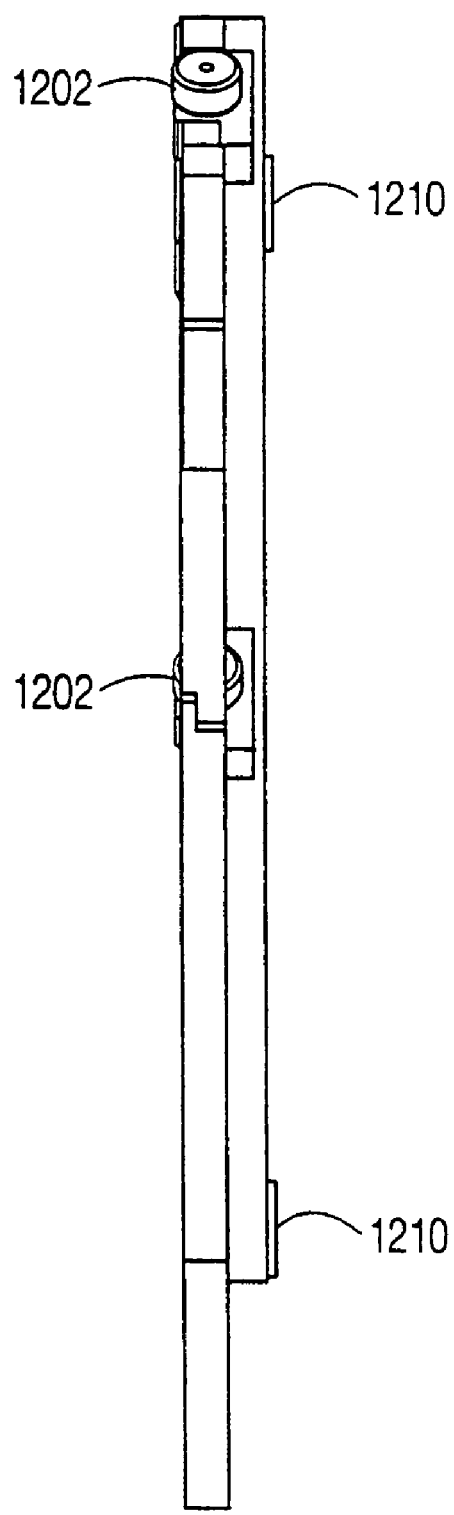

Referring to FIGS. 12A-12C, various views of swing plate assembly 728 are shown. In FIG. 12A, a bearing assembly 1200 mates with bearing assembly 1100 (shown in FIGS. 11A-11B) allowing swing plate assembly 728 to rotate about pivot point 734 (as shown in FIG. 10). Rollers 1202 are attached to the top surface of swing plate 1216 with attaching means 1204, such as screws, allowing rollers 1202 to be replaced when worn. As discussed above, rollers 1202 roll along the surface of plates 1104, 1105 (shown in FIG. 11A). Plate 1206, which may be a durable material such as steel, is attached to the bottom of swing plate 1216 and provides a surface for rollers 1108 (shown in FIG. 11A). As shown, plate 1206 is located such that it corresponds to the locus of travel 1214 of rollers 1108. Plate 1207, which may be a durable material such as steel, is attached to the top of swing plate 1216 and provides a surface for brake pad 1704 (shown in FIG. 17). As shown, plate 1207 is located such that it corresponds to the length of travel of brake pad 1704.

To provide the test head manipulator 702 with motion along a horizontal axis orthogonal to the first vertical axis, linear guide rails 1208 are provided on the top surface of swing plate 1216 and mate with corresponding slides 1300 (shown in FIG. 13A) attached to in-out plate 1310. Guide rails 1208 may be detachably coupled to the surface of swing plate 1216 so that they may be replaced when worn. Stop blocks 1210 are attached to the top of swing plate 1216 to provide travel limits for in-out plate assembly 730.

Figure 13A:
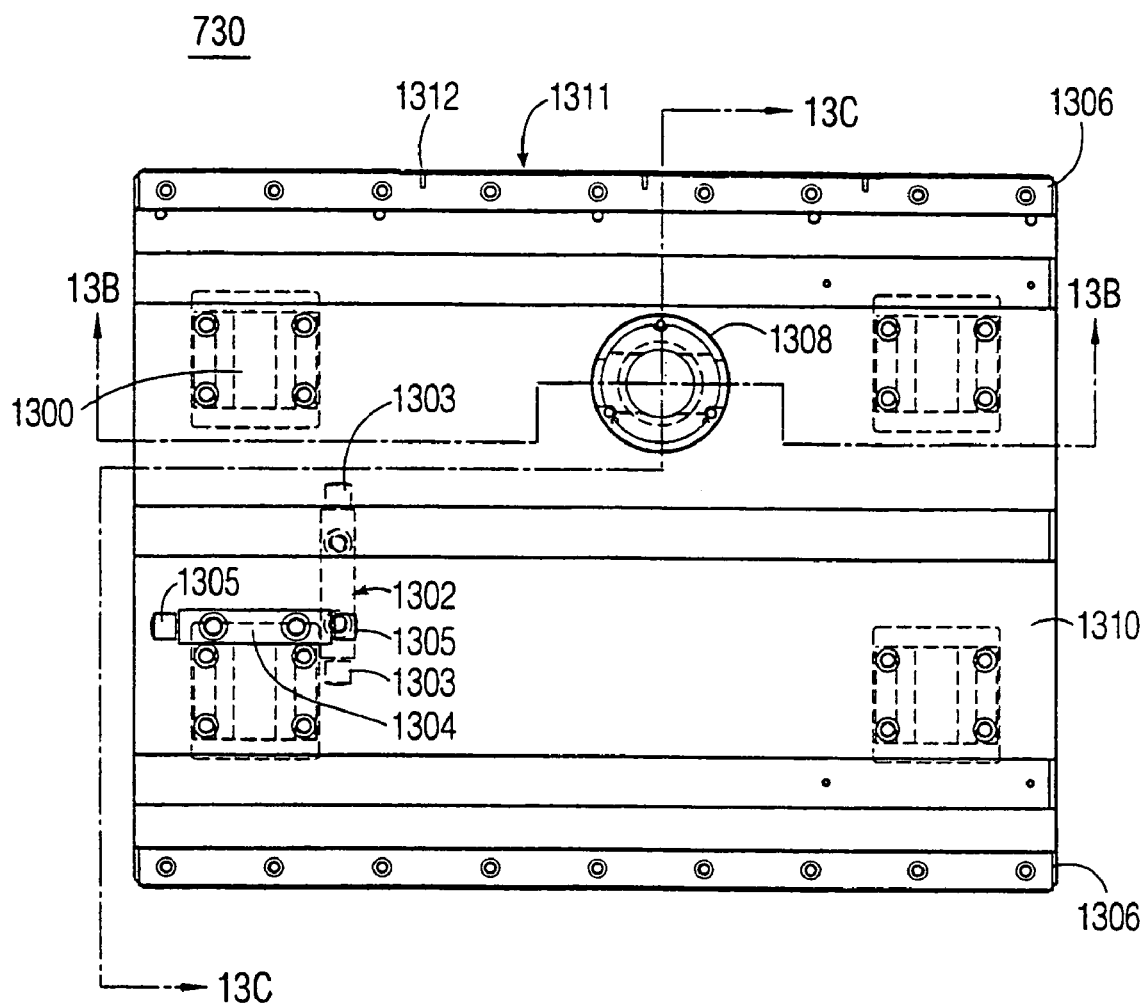
FIGS. 13A-13C are detailed views of the in-out plate portion of the base 10 assembly.
Figure 13B:
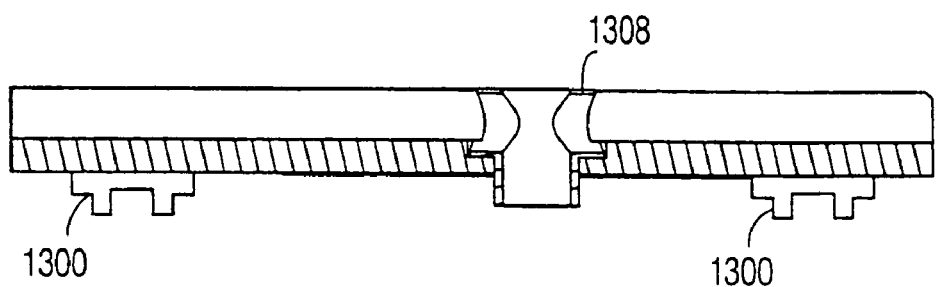
Figure 13C:
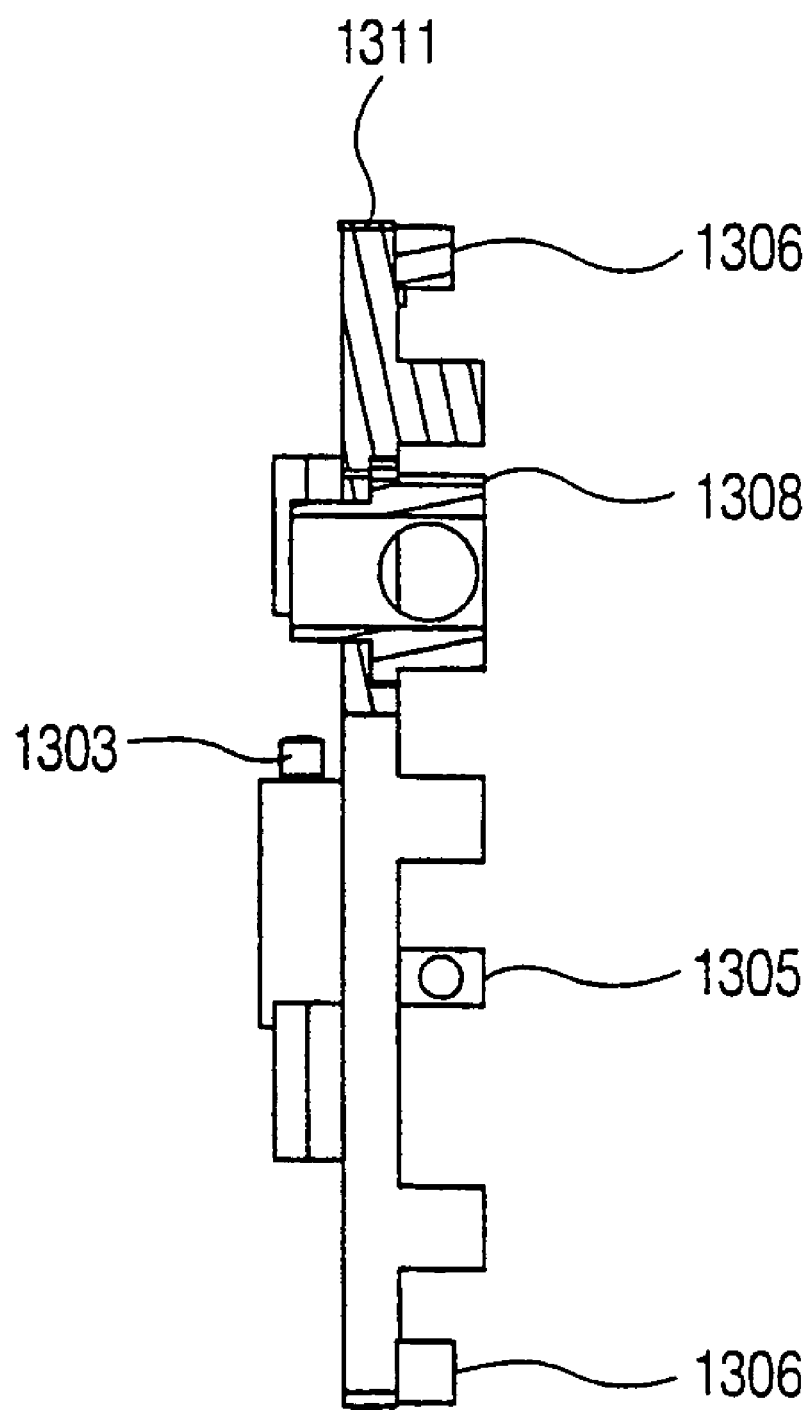

Referring to FIGS. 13A-13C, various views of in-out plate assembly 730 are shown. In FIG. 13A, slides 1300 are attached to the bottom surface of in-out plate 1310 and mate with linear guide rails 1208 (shown in FIG. 12A). The combination of slides 1300 and linear guide rails 1208 allows column structure 712 to move along the z-axis. Slides 1300 may be detachably coupled to in-out plate 1310 so that they may be replaced when worn. Bumper block 1302 is attached to the bottom of in-out plate 1310 and interfaces with stop blocks 1210 (shown in FIG. 12A) attached to swing plate assembly 728 preventing in-out plate assembly 730 from extending beyond a predetermined position relative to the swing plate assembly 728. At the ends of bumper block 1302 are bumpers 1303 formed of a resilient material, such as rubber. Bumpers 1303 are detachably coupled to bumper block 1302 for easy replacement when worn. Bumpers 1303 confront stop blocks 1210 at the limits of travel of in-out plate assembly 730.

To provide column structure 712 with motion along a further horizontal axis orthogonal to the first vertical axis and which intersects the aforementioned horizontal axis, linear guide rails 1306 are provided on the top surface of in-out plate 1310 and mate with corresponding slides 1400 (shown in FIG. 14A) attached to side-to-side plate assembly 732. Guide rains 1306 may be detachably coupled to the surface of in-out plate 1310 so that they may be replaced when worn. Brake surface 1311 is detachably coupled to the side of in-out plate 1310 using attaching means 1312, such as screws. Brake surface 1311 provides a mating surface for brake pad 1810 (shown in FIGS. 18A and 19A-19B). Bumper block 1304 is attached to the top of in-out plate 1310 to provide travel limits for side-to-side plate 732. At the ends of bumper block 1304 are bumpers 1305 formed of a resilient material, such as rubber. Bumpers 1305 are detachably coupled to bumper block 1304 for easy replacement when worn. Bumpers 1305 confront stop blocks 1404 (shown in FIG. 14A) at the limits of travel of side-to-side plate assembly 732. Sleeve 1308 is coupled to in-out plate 1310 as part of an in-out plate locking assembly discussed in detail below.

Figure 14A:
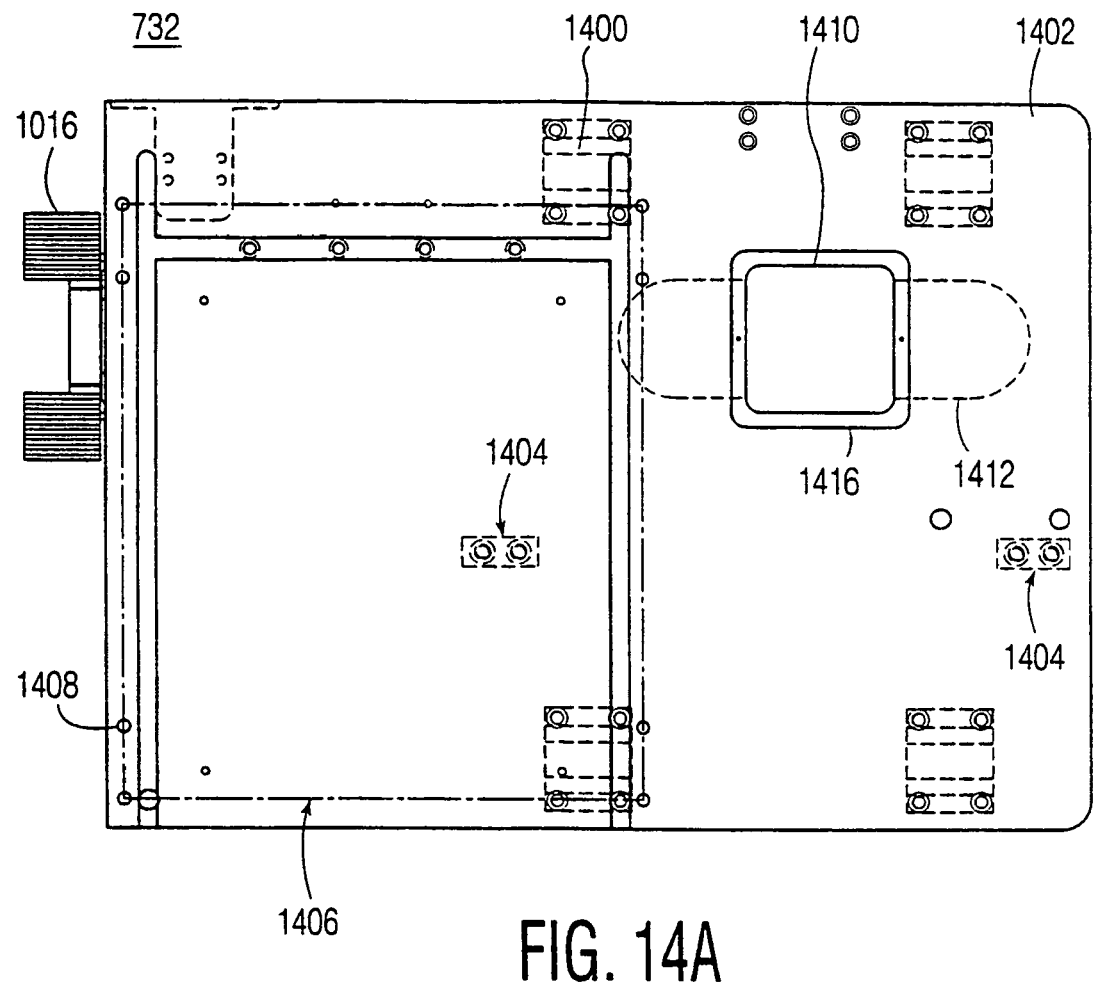
FIGS. 14A-14C are detailed views of the side-to-side plate portion of the base assembly.
Figure 14B:
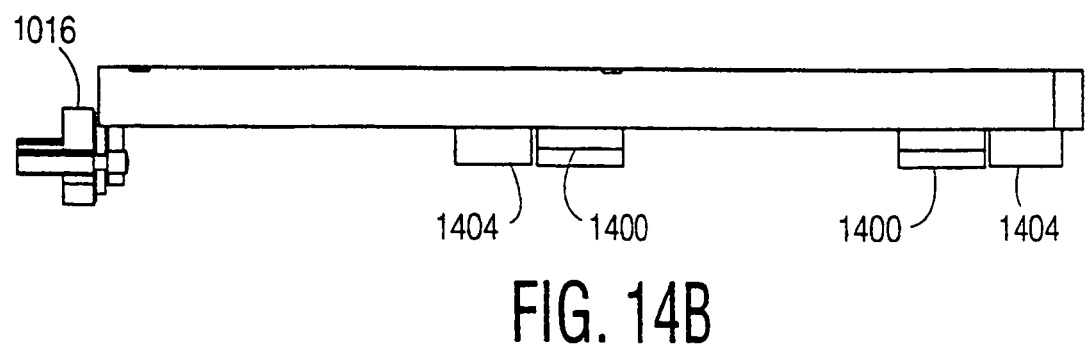
Figure 14C:
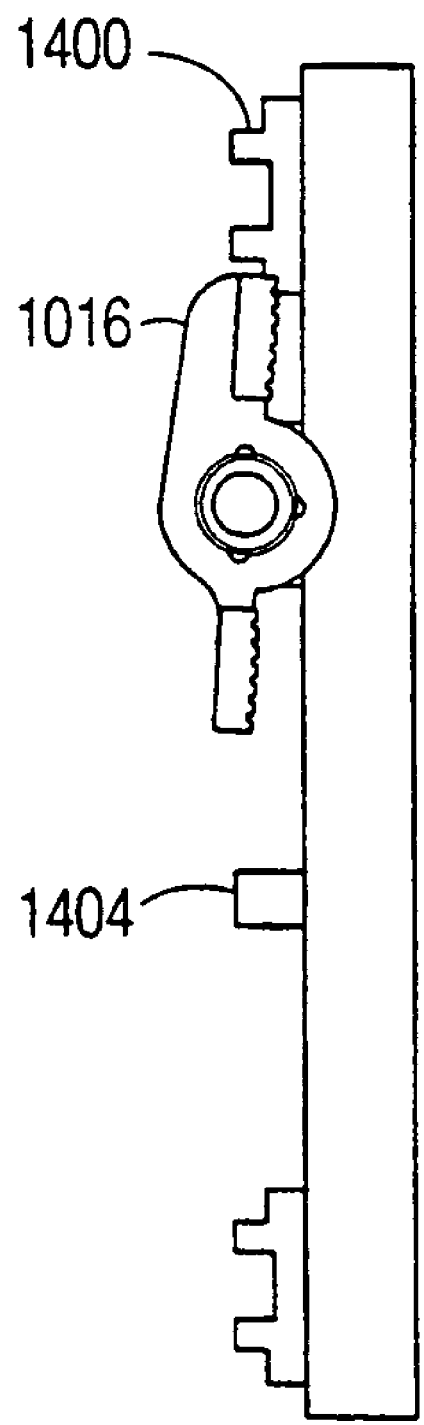

Referring to FIGS. 14A-14C, the details of side-to-side plate assembly 732 are described. In FIG. 14A, slides 1400 are attached to the bottom surface of side-to-side plate 1402 and mate with linear guide rails 1306 (shown in FIG. 13A). Slides 1400 may be detachably coupled to side-to-side plate 1402 so that they may be replaced when worn. Stop blocks 1404 are attached to the bottom of side-to-side plate 1402 and, as discussed above, interface with bumper block 1302 (shown in FIG. 13A) attached to in-out plate assembly 730 preventing side-to-side plate assembly 732 from extending beyond a predetermined position relative to the in-out plate assembly 730.

Column structure 712 (not shown in this figure) is attached to the top surface of side-to-side plate 1402 as depicted in phantom by outline 1406 at locations 1408 using conventional attaching means, such as screws (not shown). To allow access to the in-out lock mechanism (described below) access hole 1410 is provided through side-to-side plate 1402. In addition, counterbore 1412 provided at the bottom surface of side-to-side plate 1402 that allows sleeve 1308 (shown in FIGS. 13A-13C) to travel therein. Access hole 1410 may be covered as required by detachable cover 1416.

As shown in FIG. 14A, counterbore 1412 has a radius at each end that conforms to the shape of sleeve 1308. A pedal 1016 is attached at a side of side-to-side plate 1402 and is used to actuate the in-out lock discussed below.

Figure 15A:
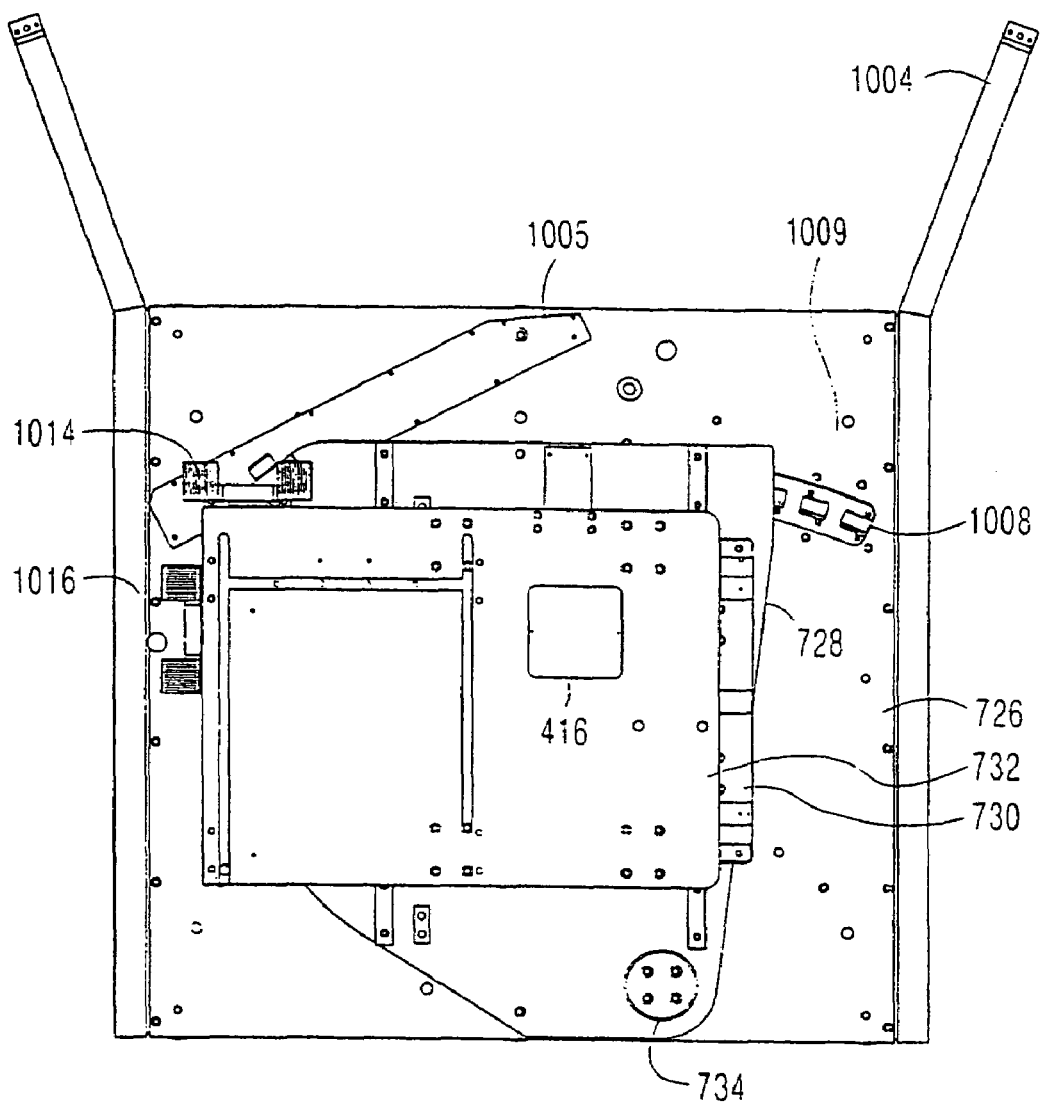
FIGS. 15A-15C are a plan view and side views of the base assembly.
Figure 15B:
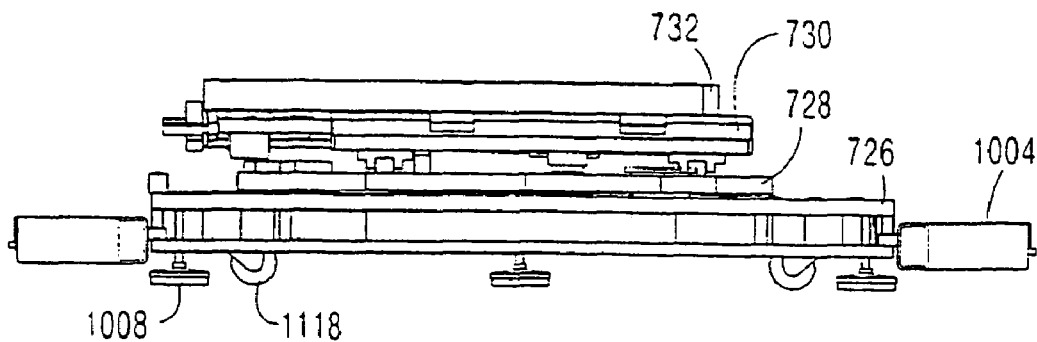
Figure 15C:
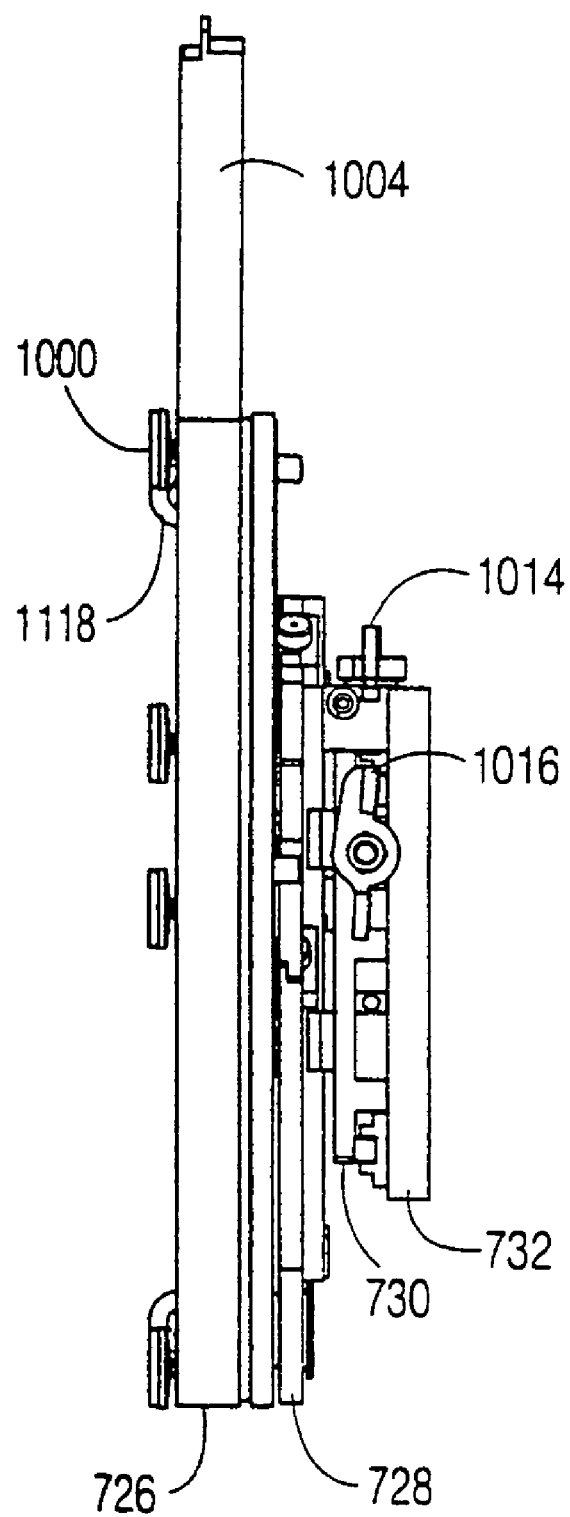

FIGS. 15A-15C are a plan view and side views of base assembly 710 which show the interrelationship of the various sub assemblies 726, 728, 730 and 732.

Figure 16A:
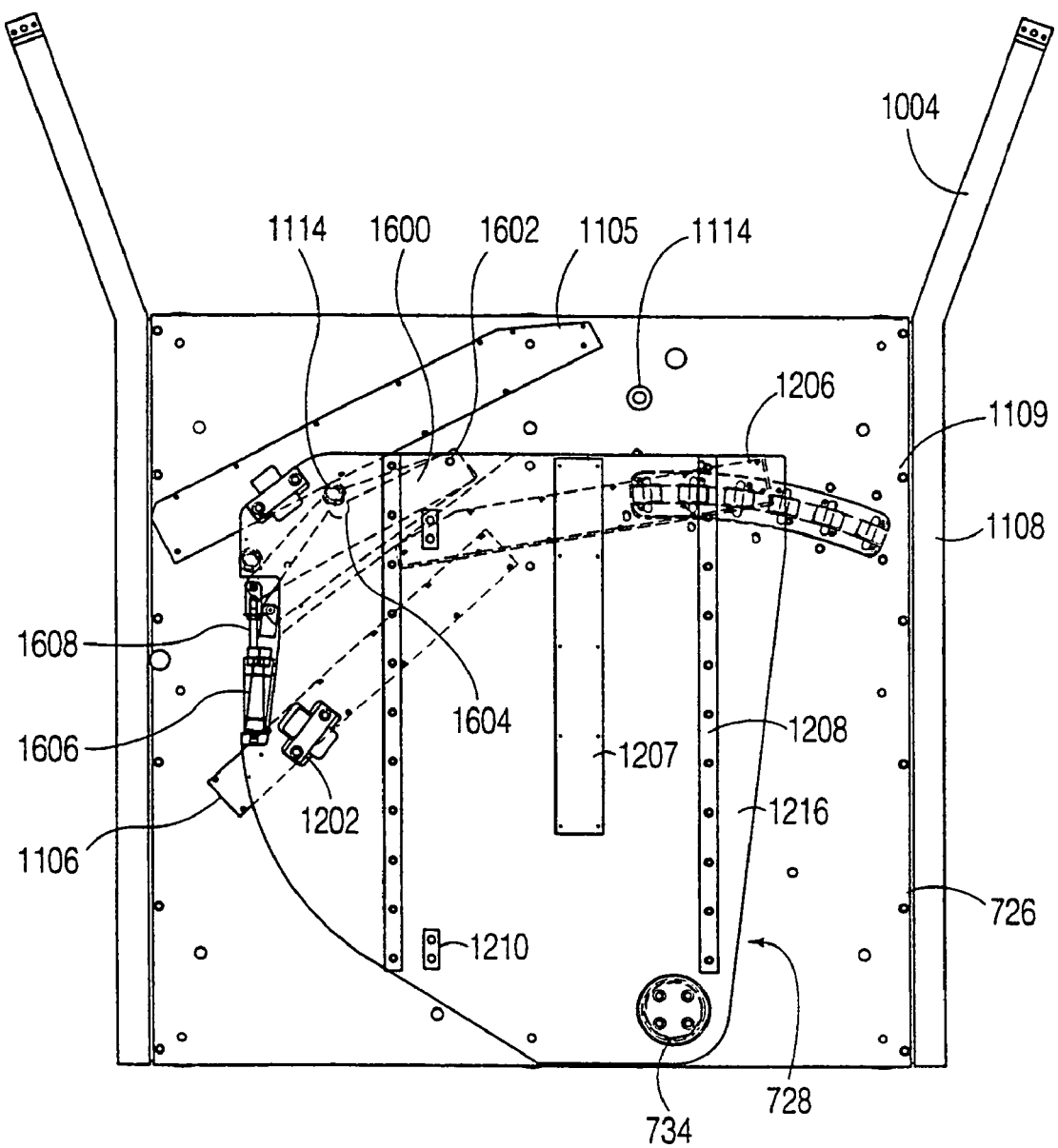
FIGS. 16A-16C are various views of the swing indexing lock assembly.
Figure 16B:
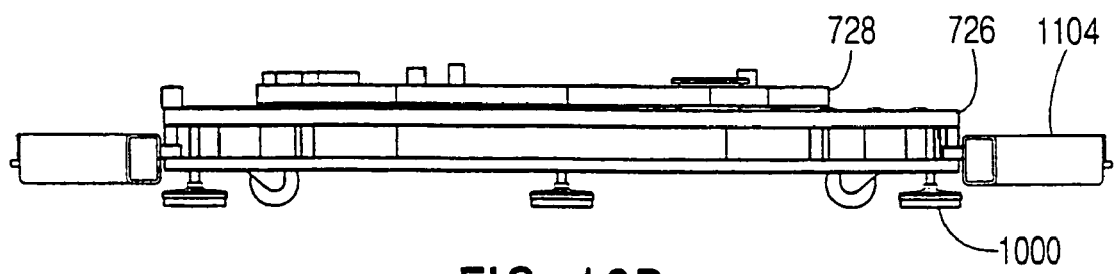
Figure 16C:
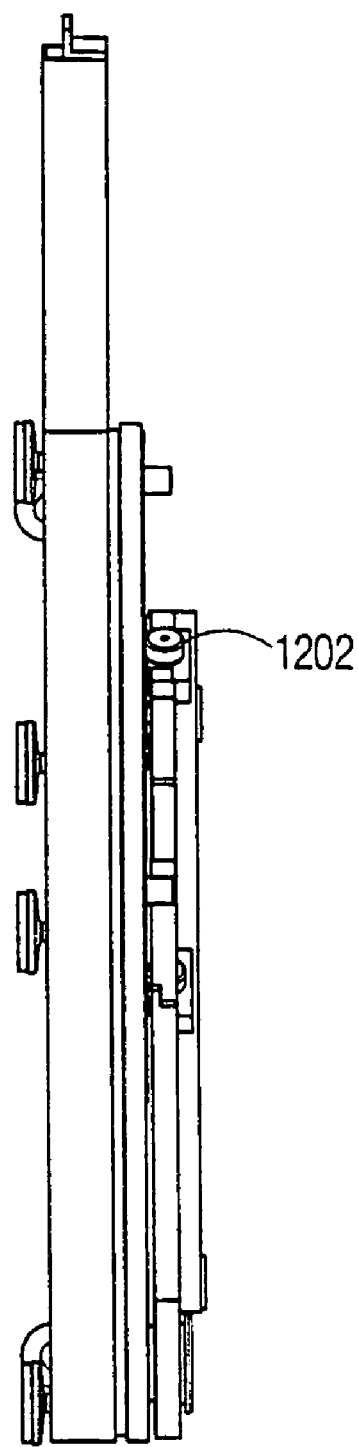

FIGS. 16A-16C are various views of the combination of bottom plate assembly 726 and swing plate assembly 728. As shown in FIG. 16A, indexing pivot arm 1600 is attached to the bottom of swing plate 1216 and actuator 1606. Indexing pivot arm 1600 rotates about pivot point 1602 and engages cam follower 1114 with notch 1604 under control of actuator 1606. In the exemplary embodiment, actuator 1606 is a pneumatic actuator but may just as well be an electric actuator or a spring operated actuator, for example. When the operator desires to move the column structure 712, the actuator is operated to release indexing arm 1600 from cam follower 1114. The column structure 712 may then be moved from the last position. Once the notch 1604 clears the previously engaged cam follower 1114, the operator may release the actuator 1606 allowing the indexing arm to move to the lock position. Of course, since the notch is clear of cam follower 1114, the column structure may still rotate freely. As the swing plate assembly 728 approaches the next cam follower, the leading edge (relative to the direction of rotation of swing plate assembly 728) of the indexing arm engages the cam follower and, under force of the cam follower, rotates about pivot point 1602 retracting the arm 1608 of actuator 1606 until notch 1604 engages the cam follower. At this point, arm 1608 of actuator 1606 forces notch 1604 to fully engage the cam follower thereby locking swing plate assembly 728 and column structure 712 in place at the desired position (at least with respect to rotation about pivot point 734).

Figure 17A:
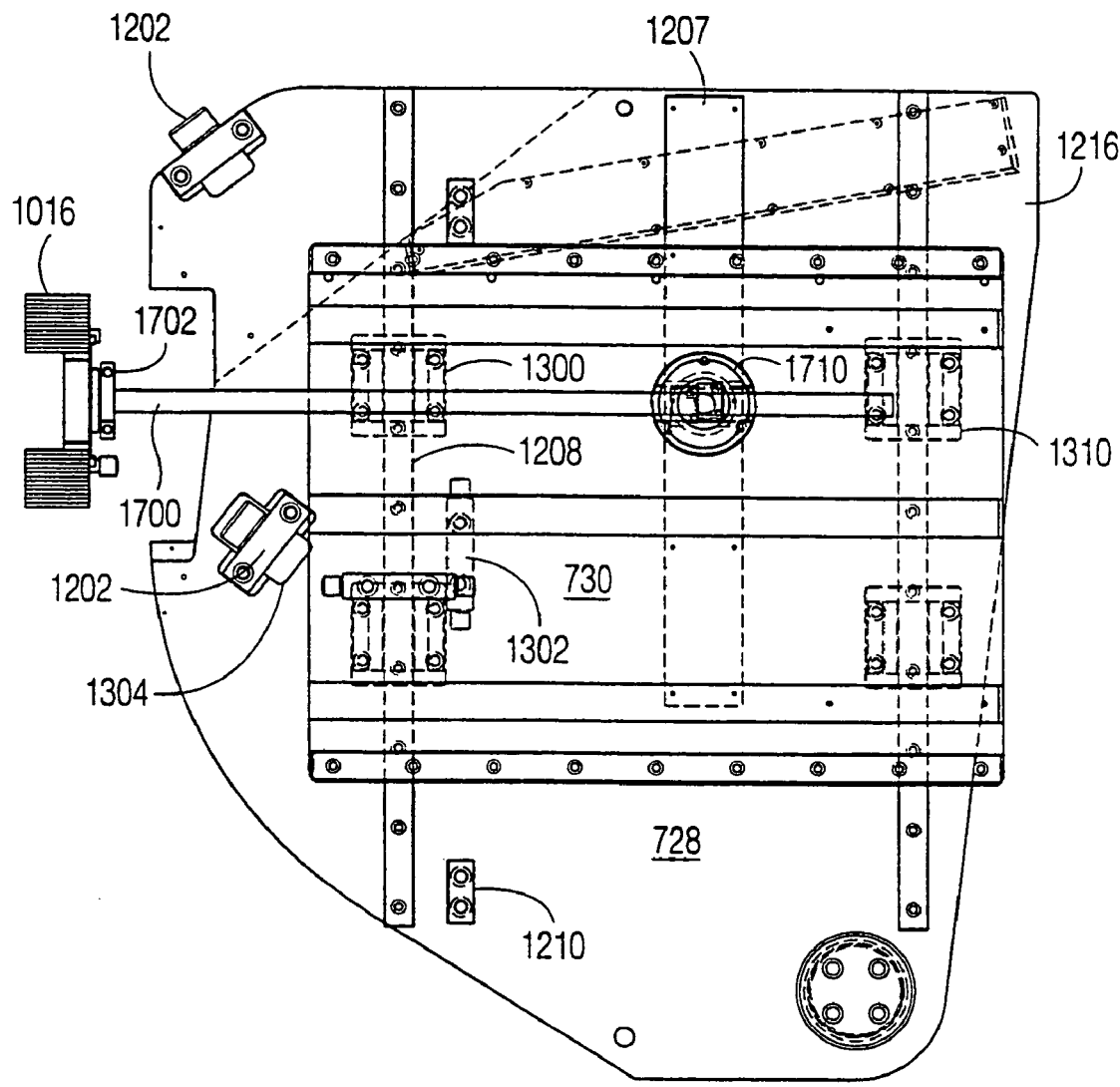
FIGS. 17A-17D are various views of the in-out axis lock assembly.
Figure 17B:
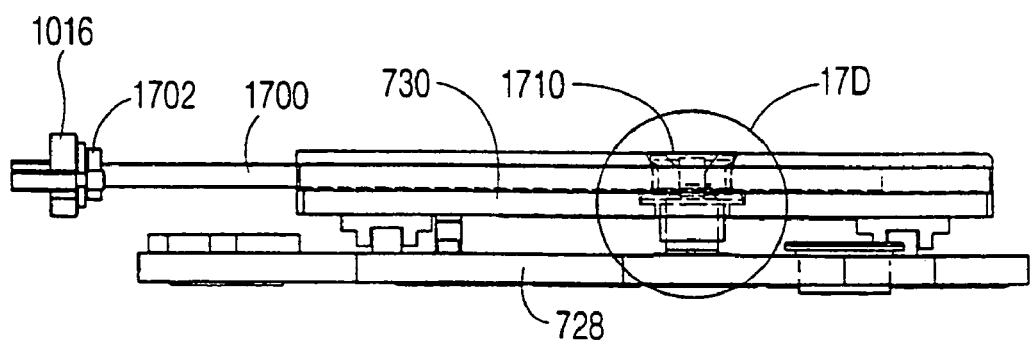
Figure 17C:
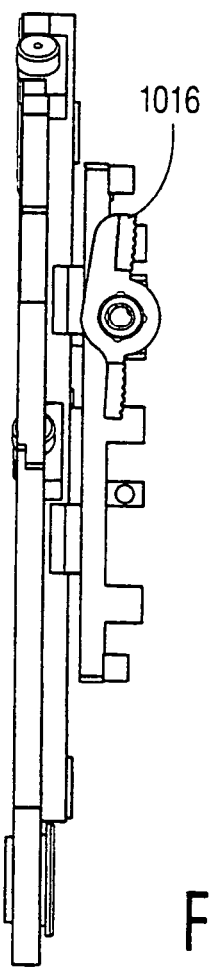
Figure 17D:
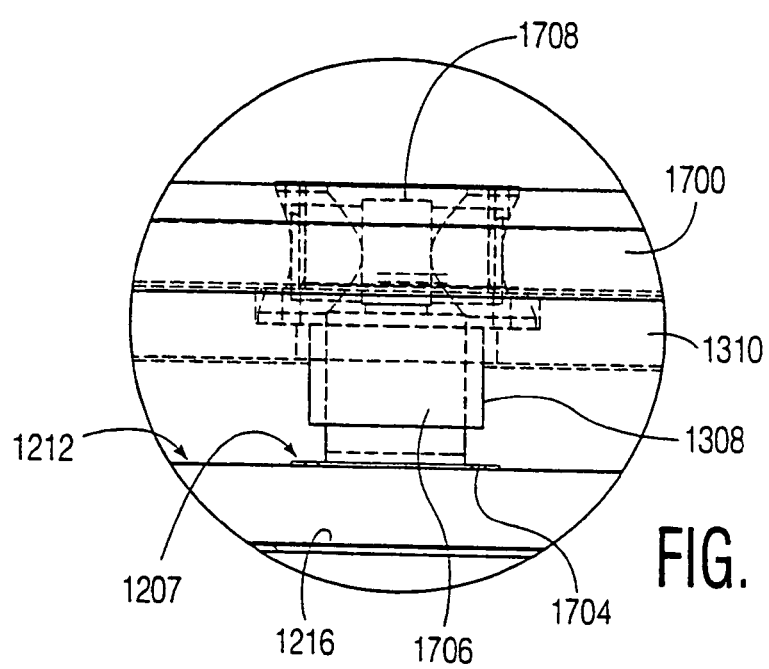

FIGS. 17A-17D are various views of the combination of swing plate assembly 728 and in-out plate assembly 730 to describe the locking of in-out plate assembly to 730 swing plate assembly 728. As shown in FIG. 17A, shaft 1700 is coupled to lock mechanism 1710 which is attached to in-out plate assembly to 730 proximate to one end of shaft 1700. Proximate to the second end of shaft 1700, a bearing attachment 1702, which is attached to the bottom surface of side-to-side plate assembly 732 (not shown in this figure), is coupled to the shaft. Bearing attachment 1702 provides support to shaft 1700 and allows shaft 1700 to rotate about its longitudinal axis.

As side-to-side plate assembly 732 moves relative to in-out plate assembly 730, lock mechanism 1710 moves along shaft 1700. To lock in-out plate assembly 730 to swing plate assembly 728, shaft 1700 is rotated about its longitudinal axis with lock pedal 1016. As shaft 1700 is rotated within eccentric lock actuator 1708, the latter engages plunger 1706 which, in turn positions brake pad 1704 in contact with a plate 1207 mounted to the top surface 1712 of swing plate 1216, thereby preventing in-out plate assembly 730 from moving forward or rearward along guide rails 1208. To release brake pad 1704, shaft 1700 is rotated in the opposite direction, thereby allowing in-out plate assembly 730 to move freely along guide rails 1208.

Figure 18A:
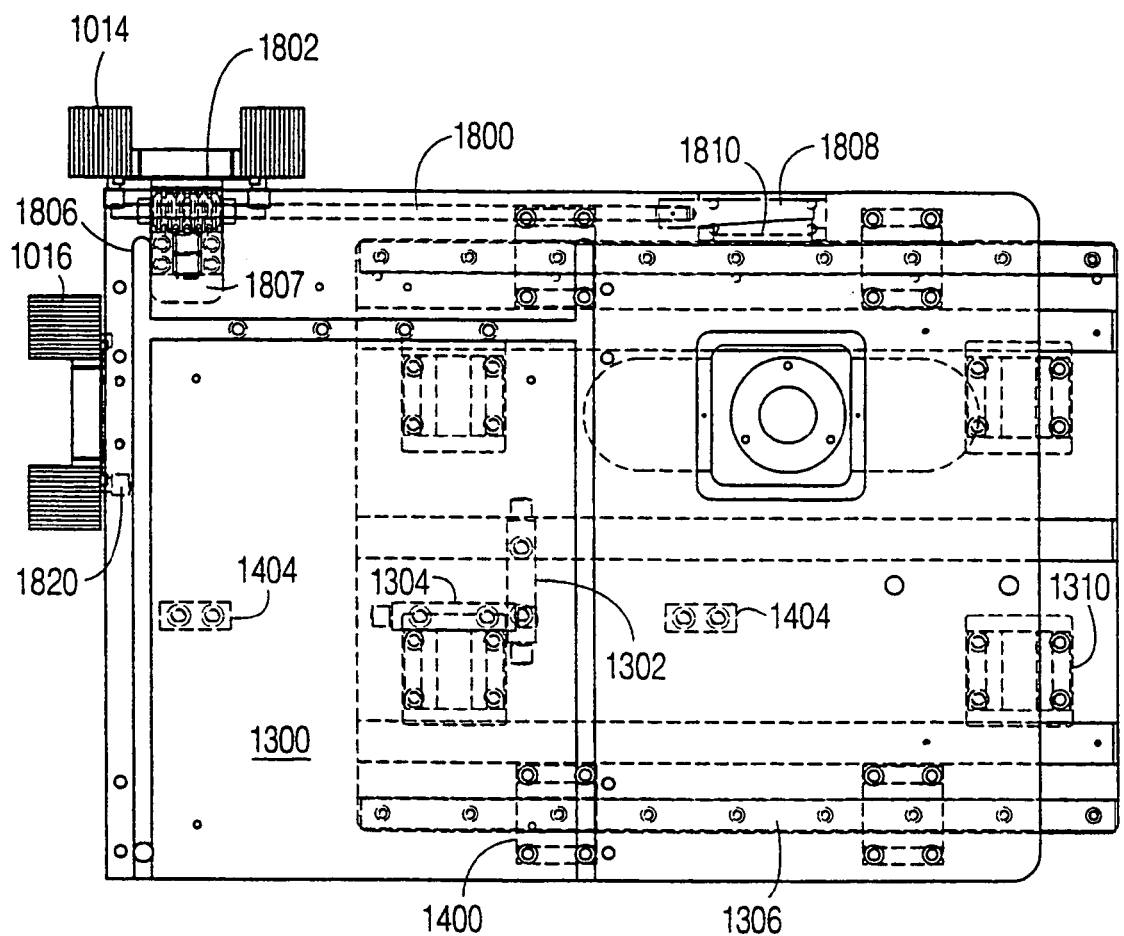
FIGS. 18A-18C are various views of the side-to-side axis lock assembly.
Figure 18B:
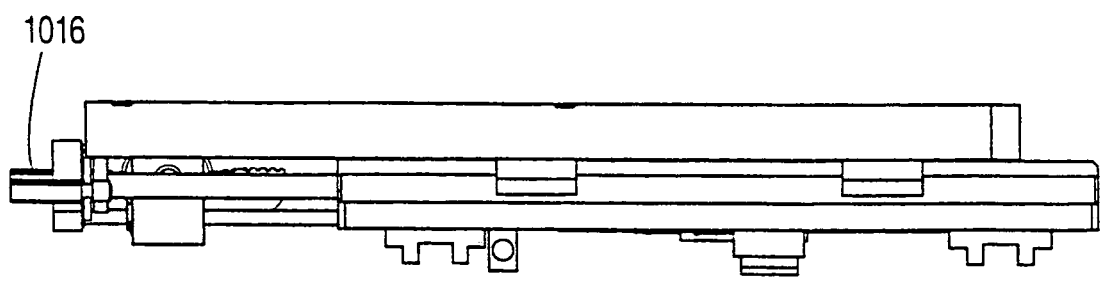
Figure 18C:
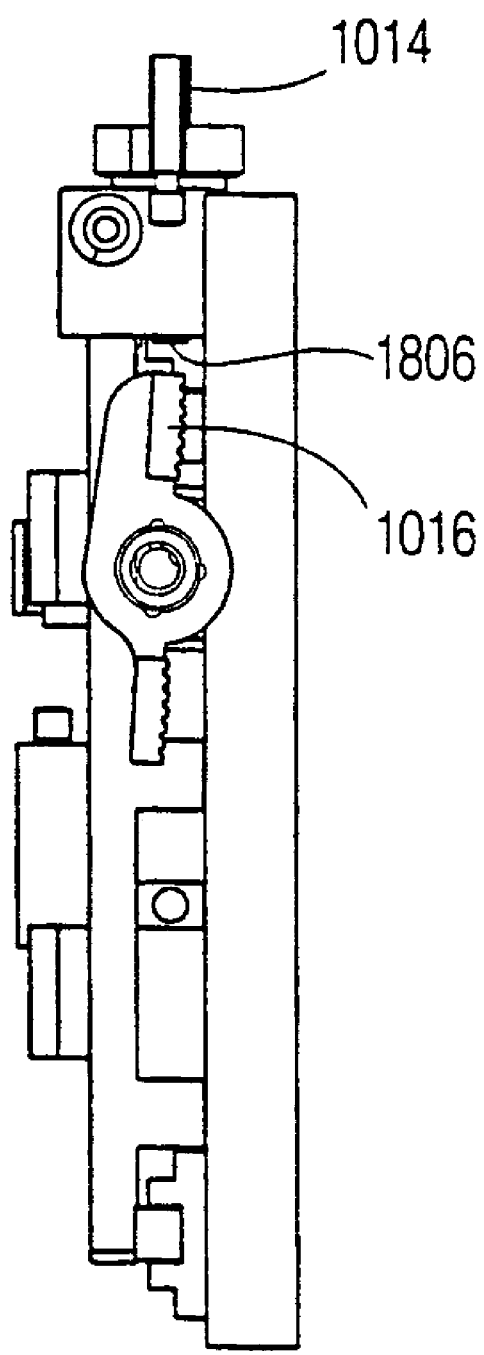
Figure 19A:
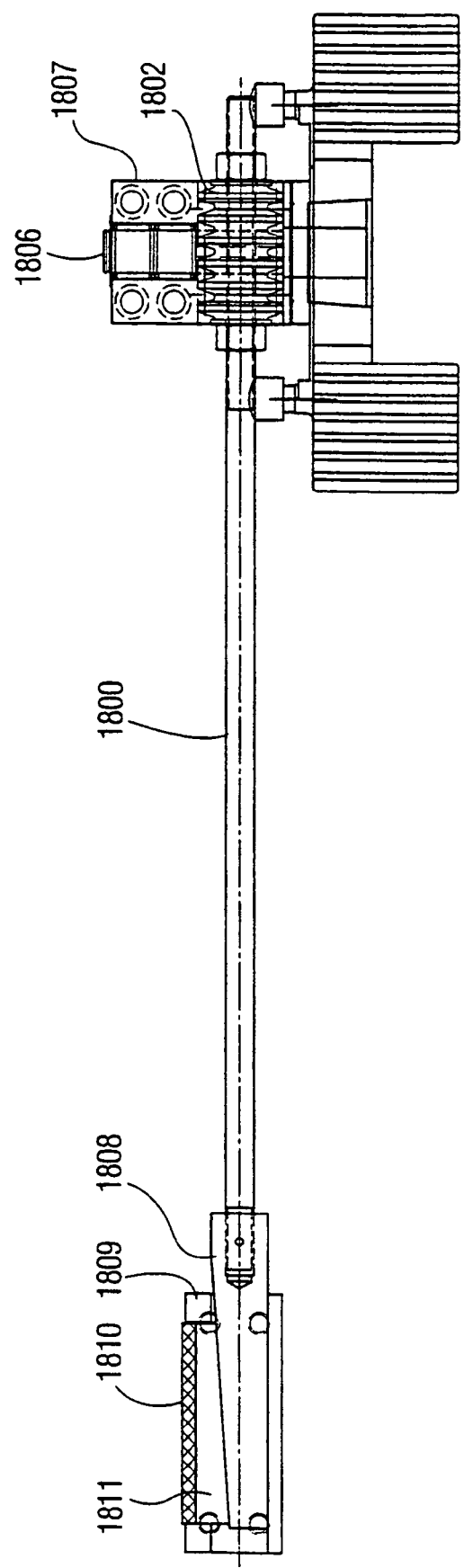
FIGS. 19A-19B are detailed views of the side-to-side axis lock assembly.
Figure 19B:
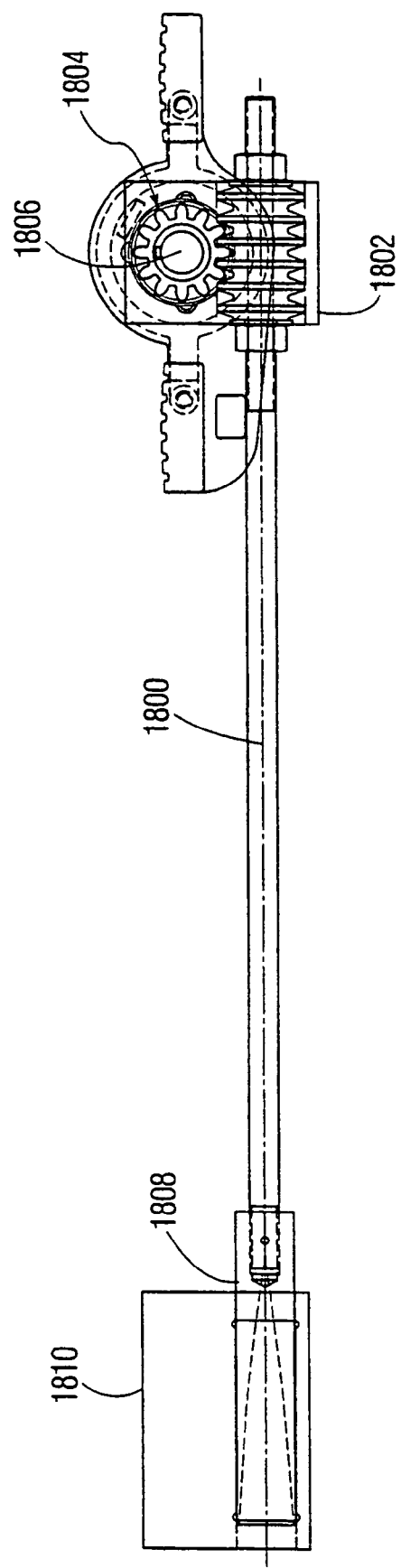

FIGS. 18A-18C are various views of the combination of in-out plate assembly 730 and side-to-side assembly 732 and describe the locking of side-to-side assembly 732 to in-out plate assembly. FIG. 19 is a detailed view of side-to-side lock assembly 1900. As shown, in FIGS. 18A, 19A and 19B, foot pedal 1014 is coupled to link 1800 at a first end through shaft 1806, spur gear 1804 and worm gear 1802. Rotation of foot pedal 1014 rotates link 1800 along its longitudinal axis. The second end of link 1800 is coupled to brake pad 1810 through wedge member 1808. Mounting brackets 1807 and 1809 are attached to the top surface of side-to-side plate 1402. The rotation of link 1800 moves link 1800 along its longitudinal axis, which in turn forces wedge member 1808 10 against wedge member 1811. The relative motion of wedge member 1808 against confronting wedge member 1811 extends brake pad 1810 (which is attached to wedge member 1811) so as to contact brake surface 1311 (shown in FIGS. 13A and 13C) attached to the side of in-out plate assembly 730, thereby inhibiting movement of side-to-side plate assembly 732 relative to in-out plate assembly 730 along guide rails 1306. To retract the brake pad 1810 from brake surface 1311, foot pedal 1014 is rotated in the opposite direction. A return spring (not shown) may be provided and coupled to shaft 1804 to provide a spring force which places foot pedal 1014 in the normally locked position, thereby requiring a positive for on foot pedal 1014 in order to unlock side-to-side plate assembly. Stops 1812 may be attached to pedal 1014 to limit rotational travel by so confronting the surface of side-to-side plate 1402. This prevents damage to the brake assembly due to excessive pressure or link 1800 and worm gear 1802 from becoming disengaged from spur gear 1806. In a similar fashion, stops 1820 may be attached to pedal 1016.

Figure 20:
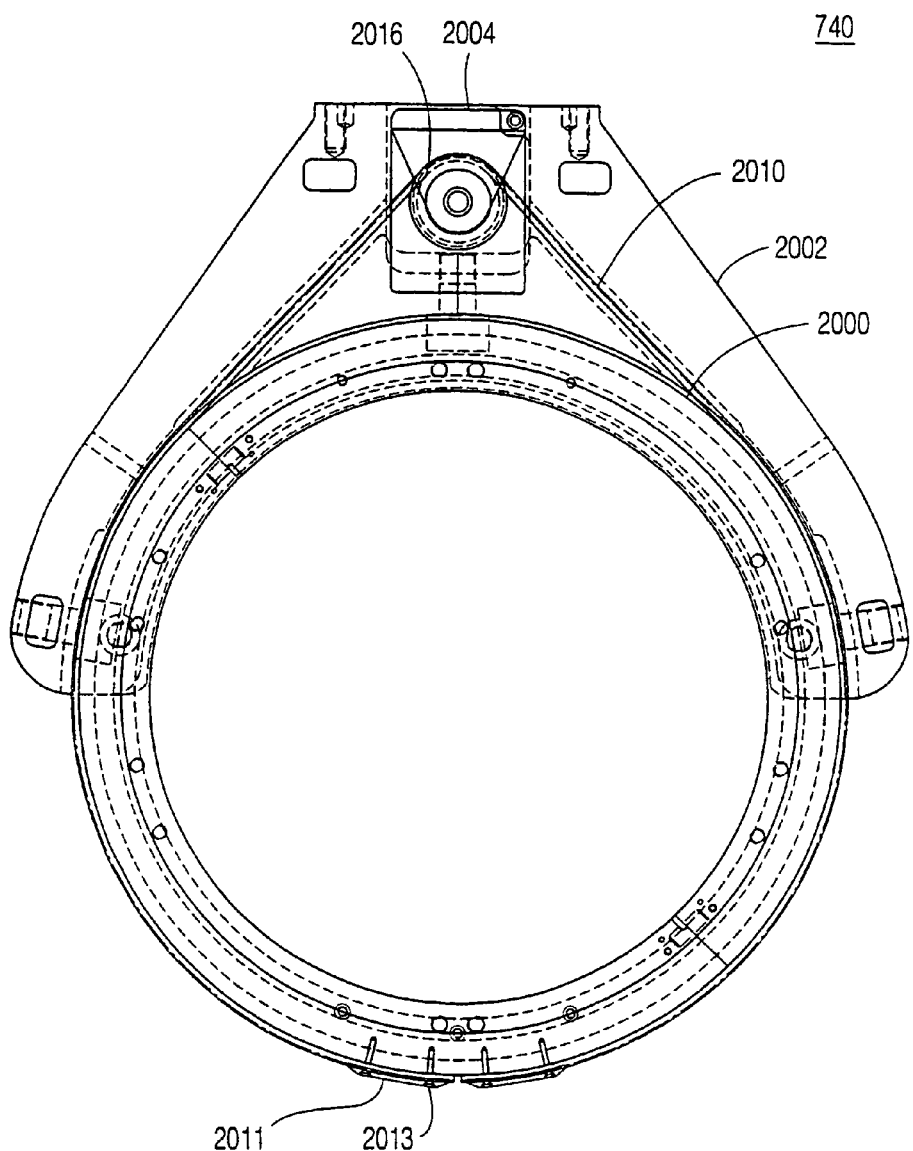
FIG. 20 is a front view of the roll motor and associated hardware for rotating the test head about the roll axis.
Figure 21:
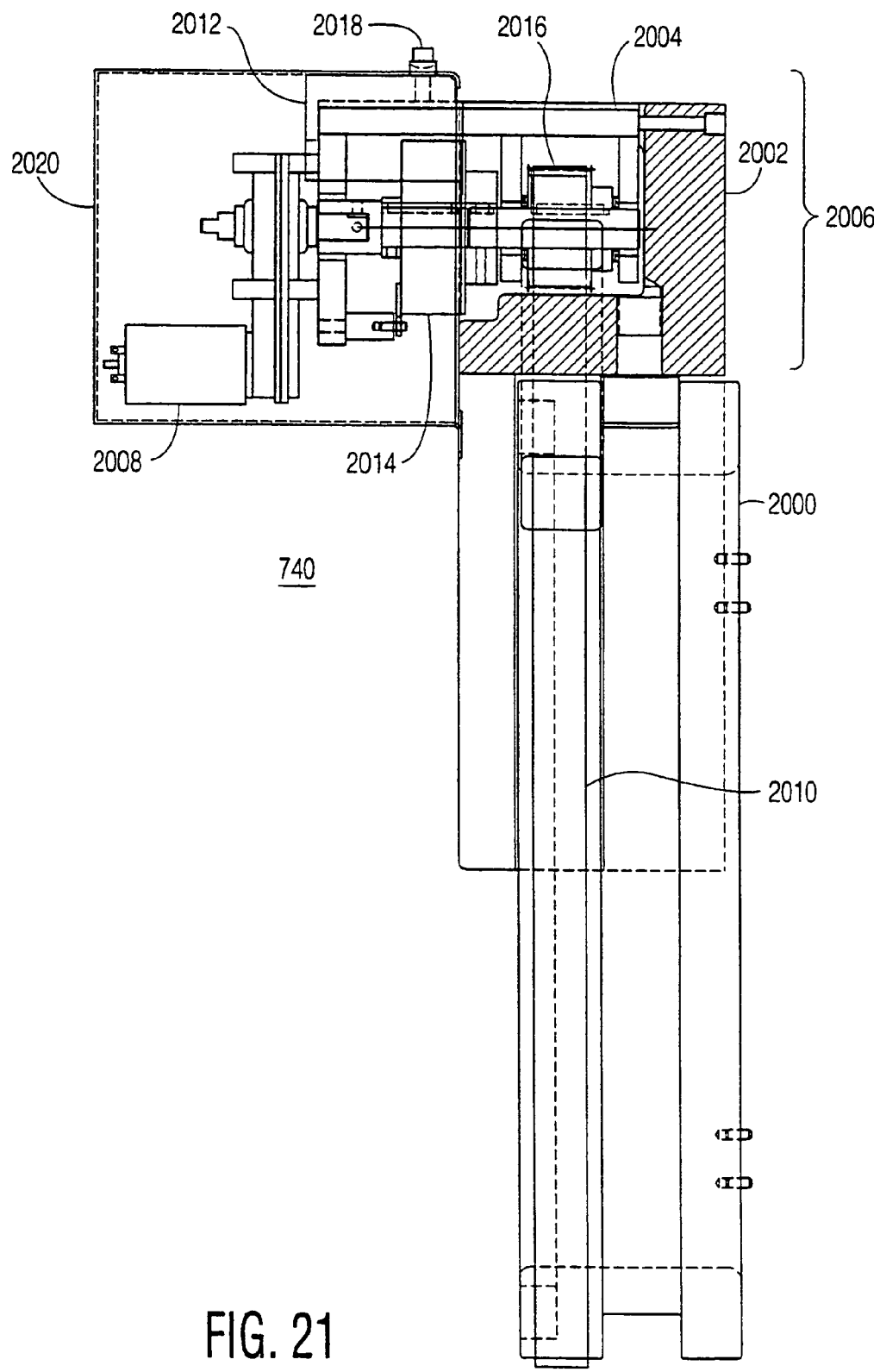
FIG. 21 is a partial side view of the roll motor and associated hardware.
Figure 22:
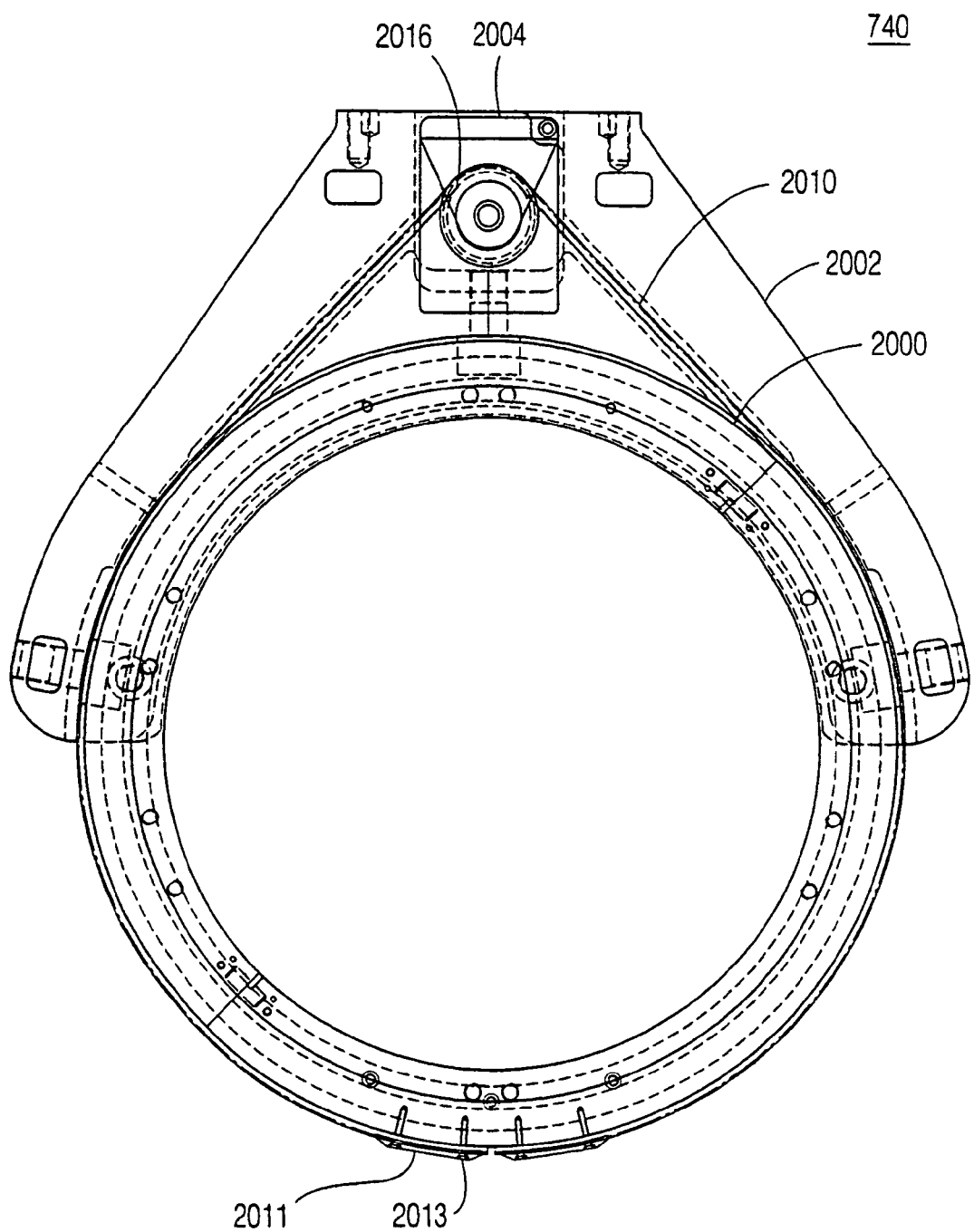
FIG. 22 is back view of the roll motor and associated hardware.

FIGS. 20 and 22 are a front view and a rear view, respectively, of test head coupling 740. Test head coupling 740 is attached to the test head 802 and main arm 736 providing means whereby test head 802 may be rotated (rolled) about the Z-axis. In FIG. 20, test head coupling includes roll motor assembly 2006, timing belt 2010, and adapter ring 2000. Adapter ring 2000 is coupled to roll motor assembly 2006 at pulley 2016 with timing belt 2010, and rotates with respect to roll motor assembly 2006 under control of drive motor 2008 (shown in FIG. 21). In the exemplary embodiment of FIG. 20, timing belt 2010 is attached to adapter ring 2000 using clamps 2011 in order to reduce slippage between the adapter ring 2000 and the timing belt 2010. It is contemplated that clamps 2011 may be placed on the surface of timing belt 2010 and sandwich the timing belt 2010 between clamp 2011 and adapter ring 2000 using attaching means 2013, such as screws. Although two clamps 2011 are shown in FIG. 20, the number of clamps 2011 may be any s number including a single clamp if desired. Furthermore, in the exemplary embodiment, it is contemplated that the timing belt 2010 is not continuous (i.e., a split belt) with the ends of the timing belt 2010 attached with clamps 2011. This is done to facilitate installation of the timing belt 2010 in view of the construction of the cable pivot units. Of course, the timing belt may also be a continuous belt if desired and feasible with regard to mechanical constraints.

FIG. 21 is a partial side view of the roll motor assembly and associated hardware. As shown in FIG. 21, roll motor assembly 2006 includes cable pivot housing 2002, frame assembly 2004, drive motor/gearbox 2008, frame mount bracket 2012, clutch 2014, clutch rotation limiting part 2015, pulley 2016 and adjuster 2018. Cover 2020 may be applied over the drive motor/gearbox 2008, clutch 2014, limiter 2015 and frame mount 2012 to protect them from dirt, moisture, etc.

Next, the details of pivot assembly 2006 and the rotation of adapter ring 2000 relative to pivot assembly 2006 are described, again referring to FIG. 21. Upon application of electrical energy, drive motor/gearbox 2008 is energized and clutch 2014 is engaged. Rotation and torque generated by the motor/gearbox 2008 is coupled through clutch 2014 causing pulley 2016 to rotate. Rotation of pulley 2016, which is coupled to timing belt 2010, imparts rotation of ring 2000 about its axis, which, in the exemplary embodiment, is the z-axis. The tension with which pulley 2016 exerts on timing belt 2010 may be adjusted with adjuster 2018. In the exemplary embodiment, adjuster 2018 is a screw, but may be any other means by which tension may be exerted by pulley 2016 on timing belt 2010, such as a spring assembly. Rotating adjuster 2018 in the clockwise direction, for example, pulls on frame assembly 2004. In turn, frame assembly 2004 rotates about frame mount 2012 (which acts as a pivot point) moving pulley 2016 along an arc which, in turn, pulls on timing belt 2010, thereby increasing the tension of timing belt 2010.

Clutch 2014 is coupled between the gearbox 2010 and pulley 2016. In the exemplary embodiment, clutch 2014 is electrically controlled and engages upon application of electrical energy to the clutch. When electrical energy is removed from the clutch 2014, it will disengage thus preventing rotation of motor/gearbox 2008 from further driving pulley 2016. With clutch 2014 disengaged, the test head may be easily and normally rotated by hand, or by the docking actuator, about the z-axis.

Figure 23:
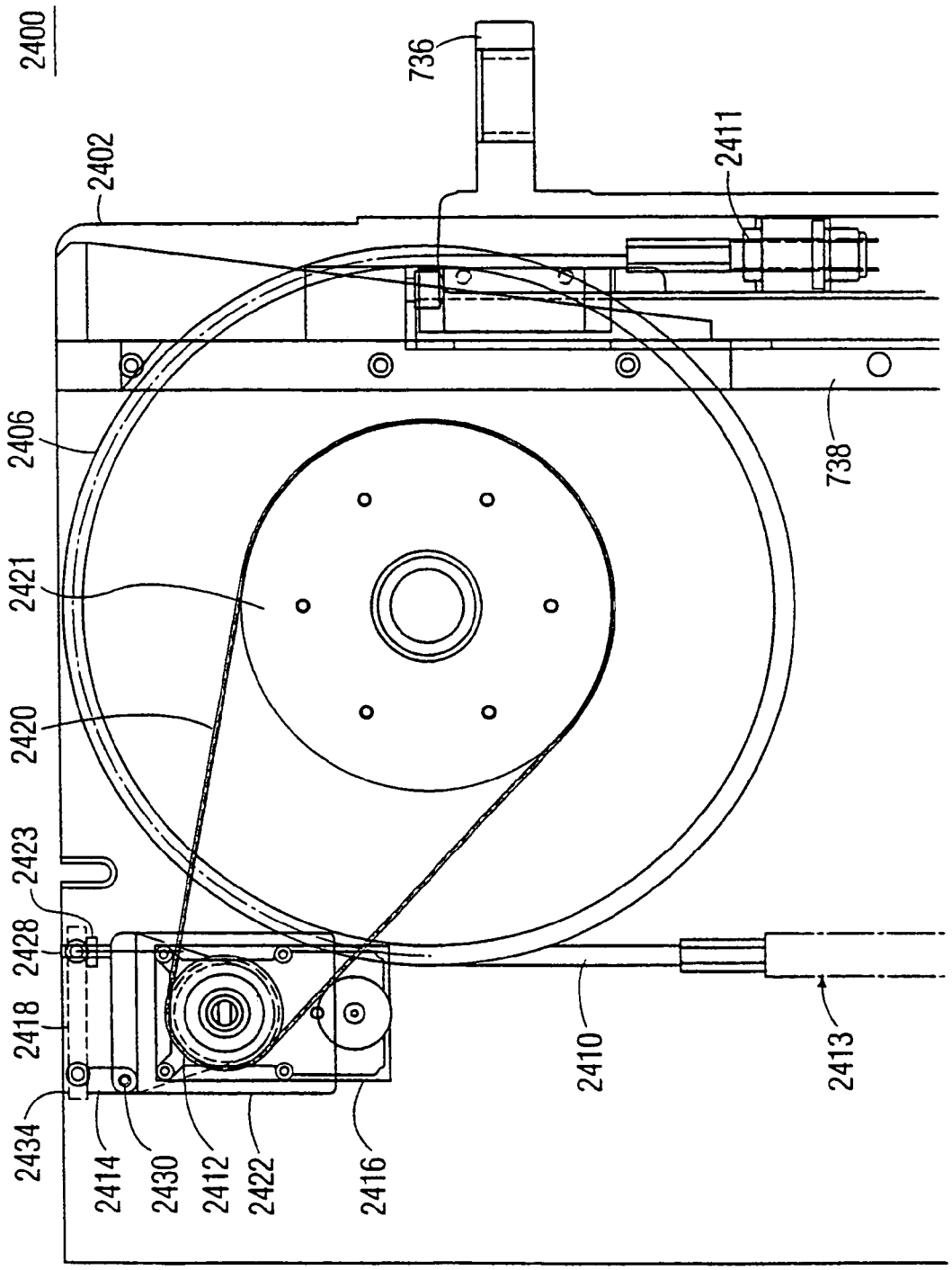
FIG. 23 is a side view of the vertical motor and associated hardware for raising and lowering the test head.
Figure 24:
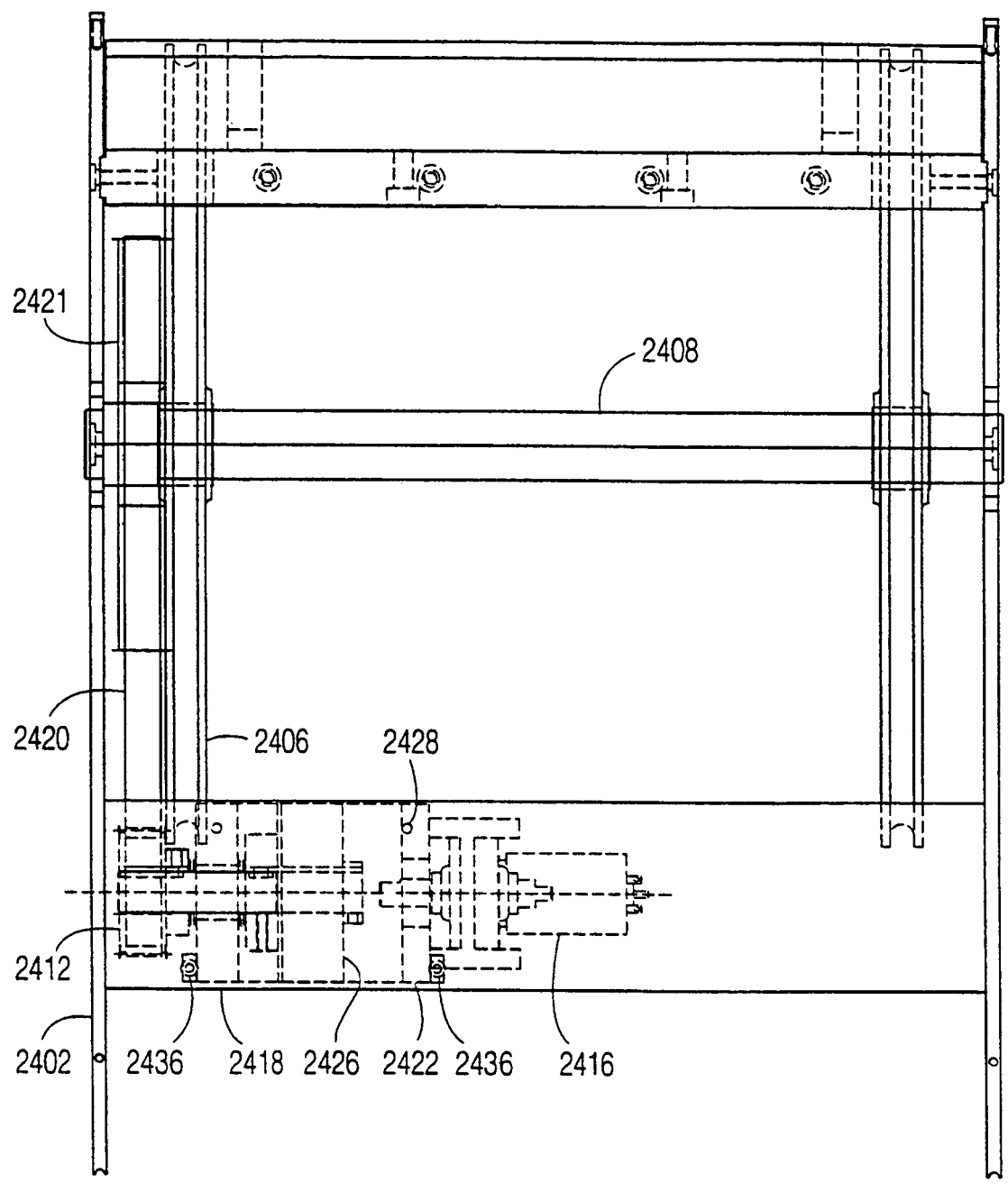
FIG. 24 is a top view of the vertical motor and associated hardware.

FIGS. 23 and 24 are a side view and a top view, respectively, of the vertical motor and associated hardware (drive system 2400) for raising and lowering the test head for moving test head 802 along a linear guide rail 738 (shown in FIGS. 7A and 7B) defining a vertical (y) axis for the test head 802. As shown in FIGS. 23 and 24, the major components of drive system 2400 include pulley 2406, cable 2410, electric motor/gearbox 2416, clutch 2426, small pulley 2412, timing belt 2420 and large pulley 2421. Cable 2410 is attached, at a first end 2411, to main arm 736 (shown in FIGS. 7A and 7B), and at a second end to a counterbalance 2413. Main arm 736 is coupled to linear guide rail 738 and moves along linear guide rail 738 under control of cable 2410. In the exemplary embodiment two cables 2410 and two pulleys 2406 are shown, although greater or fewer pulleys and cables may be used as desired.

Pulleys 2406 are rotatably attached to columns 2402, which form the side members of column structure 712 (shown in FIGS. 7A and 7B), with shaft 2408, which in the exemplary embodiment, is a single shaft common to both pulleys 2406. A motor drive assembly, including electric motor/gearbox 2416 and clutch 2426 is attached to frame assembly 2422, which, in turn is attached to mounting bar 2418 through mounting bracket 2414. Mounting bar 2418 is attached between columns 2402 at a rear portion thereof and behind pulley 2406.

Small pulley 2412 is coupled to large pulley 2421 through timing belt 2420. The large pulley 2421 is attached to one of pulleys 2606 with attaching means 2407, such as screws. Application of electrical energy to motor/gearbox 2416 provides a rotational force to electrically operated clutch 2426, which, in turn, drives small pulley 2412. As small pulley 2412 rotates, timing belt 2420 is caused to drive pulley 2606 through its coupling to large pulley 2421.

The function of clutch 2426 is similar to the function of clutch 2014 and its description is not repeated. To maintain adequate tension on timing belt 2420 by small pulley 2412, adjuster 2428, which may be set screws for example, is provided. In a preferred embodiment, two adjusters 2428 are used, each at opposite ends of frame 2422. Using two adjusters 2428 helps to avoid any possible torsional deflection of the frame assembly 2422 that may effect the tension on timing belt 2420. In the exemplary embodiment, adjuster 2428 is threaded through mounting bar 2418 and applies downward pressure, when rotated in a predetermined direction, to a rear portion of frame assembly 2422. This downward pressure imparts rotation of frame assembly 2422 about pivot 2430, which, in turn, increases the tension that small pulley 2412 applies to surface timing belt 2420. Of course, it is understood that rotating adjuster 2428 in opposite direction will reduce the tension that small pulley 2412 applies to timing belt 2420. Once adjusted, adjuster 2428 may be secured or locked in place with a nut 2432, for example, which, when tightened against a bottom portion of mounting bar 2418, prevents adjuster 2428 from changing position. In the exemplary embodiment, a screw that couples an end, portion of frame assembly 2422 to mounting bracket 2414 may provide pivot 2430. In the exemplary embodiment, mounting bracket 2414 is attached to mounting bar 2418 with screws 2436 which are recessed below the surface of mounting bar 2414.

In an exemplary embodiment of the present invention, axes are arranged so that movement along or about any axis can be done substantially unimpeded with reasonably low and reasonably constant force throughout substantially the entire range of motion available along or about said axis. Specifically, the following effects are desirable:

a) In the vertical, up-down, axis the test head is in a substantially weightless condition and may be manipulated by hand for easy and accurate docking and undocking.

b) In horizontal axes of swing, in-out, and side-to-side, low friction bearings and components may be used to enable the test head to be manipulated by hand. This is true whether the horizontal motion is derived in the base or in an articulating arm assembly or by a combination of both.

c) In the pitch and roll axes, the test head is desirably mounted along axes passing through its center of gravity to enable the test head to be manipulated by hand. The use of the cable pivot and cable support help to maintain this effect in view of the cable.

d) The location of the axis of swing rotation and the vertical motion of the cable support help to achieve qualities of substantially unimpeded availability of motion throughout substantially the entire motion envelope.

Thus, in an exemplary embodiment of the present invention, a powered motion mode is added to any single available motion or to any selected combination of available motions, either rotational about an axis or translational along an axis. In other words, for each available motion to be powered, a motor or actuator is added, along with its appropriate control circuitry and operator interface, and arranged in a way so that it is mechanically decoupled from the positioner motion when it is not in use so that the substantially unimpeded motion remains available and unaffected. If all of the available motions require only a small amount of relatively constant force, low powered actuators may be used. Thus, the following may apply:

a) The actuator may be an electric motor.

b) Gearing may be used as appropriate on the output of the motor or actuator.

c) The means to couple and decouple the actuator/motor to the motion axis may be a clutch.

d) A slip clutch or mechanism may be used if appropriate to limit applied force.

e) The force applied by the actuator may be regulated by control circuitry such that enough force is applied to cause motion but limited to an extent to cause the actuator to stall if an obstruction to substantially unimpeded motion occurs.

f) If the actuator is a DC electric motor, the force regulation is achieved by limiting the current supplied to the motor which in turn limits the torque output of the motor.

Substantially unimpeded motion may thus be made for docking in the powered axis. The force desirable for this motion may be reasonably constant and need not vary with position or displacement as the dock is actuated. Complex control schemes and clever mechanisms may thus be needed. Furthermore, substantially unimpeded notion 5 is available for human positioning throughout essentially the entire motion envelope.

The above description has included an explanation of specific details relating to vertical translation and roll rotation. All other axes are possible and follow the same general principles.

Figure 25:
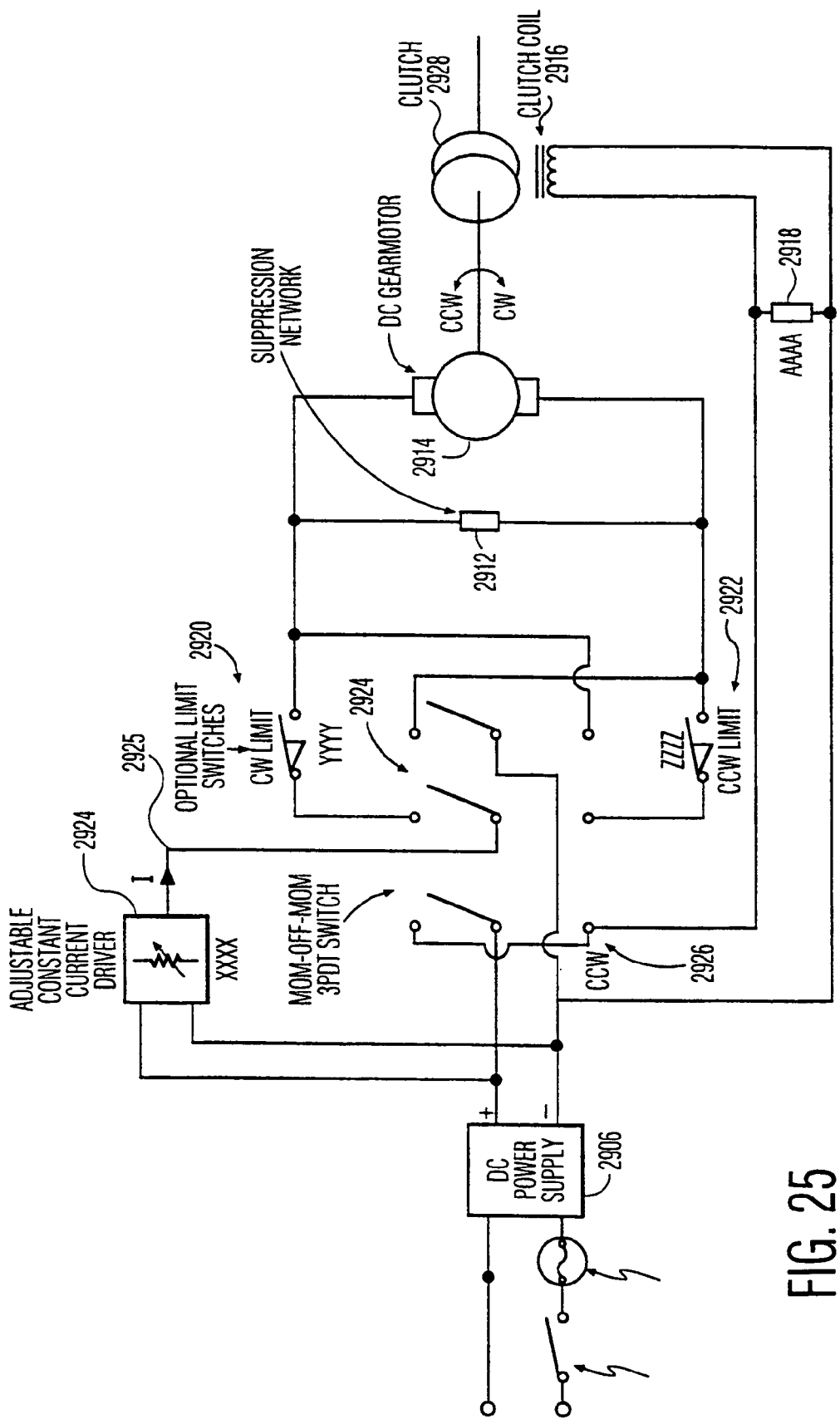
FIG. 25 is a simplified schematic of a single axis control circuit.

FIG. 25 is a simplified schematic of a single axis control circuit. In FIG. 25, a voltage source (not shown) is provided to power supply 2906 through switch 2902 and overload protection device 2904, such as a fuse or a circuit breaker. The output of power supply 2906 may be a predetermined fixed voltage for example depending on the requirements of the circuits to be driven. The output of power supply 2906 is coupled to a constant current driver 2924 and direction selector 2910. The output of constant current driver 2924 is also coupled to direction selector 2910. It is contemplated that the output current 2925 of constant current driver 2924 may be fixed or adjustable as desired. In the exemplary embodiment, the output voltage of power supply 2906 is about 24 volts DC and the output current 2925 is adjustable up to about 2.5 amperes. In the exemplary embodiment, direction selector 2910 is a three-position momentary action switch with the center position being the normal position. One set of output terminals 2924 of selector 2910 are connected to optional limit switches 2920 and 2922, which are in turn connected to suppression circuit 2912 and motor 2914. This first set of output terminals 2924 provides output current 2925 to motor 2914, such as a DC gear motor.

A second set of output terminals 2926 provides the output voltage from power supply 2906 to suppression circuit 2918 and clutch coil 2916. When selector 2910 is in the center position, energy is not provided to motor 2914, the clutch 2916 or their associated components. The output terminals of selector 2910 are cross-connected to one another such that, when in a first non-center position, selector 2910 provides the output of constant current driver 2924 to suppression circuit 2912 and motor 2914 in a first polarity allowing the motor to rotate in a predetermined direction. Due to the cross connection discussed above, moving selector 2910 to the second non-center position provides the output of constant current driver 2924 to suppression circuit 2912 and motor 2914 in a polarity opposite to the first polarity. In turn, motor 2914 will rotate in the opposite direction to the direction when the first polarity voltage was applied to the motor 2914. The clutch coil 2916 is energized and engages the clutch whenever selector 2910 is in a non-center position.

The torque developed by motor 2914 is proportional to the current supplied by the constant current driver 2924 through selector 2910. This torque is transferred to a mechanical load (not shown) through clutch 2928. As discussed above, when selector 2910 is in the center position, motor 2914 is not energized, torque is not developed and clutch 2918 is not engaged. Therefore, the mechanical load is floating (i.e., free to move, without constraint imposed by a need to back drive the motor and gearbox, whether energized or not). On the other hand, when selector 2910 is in a non-center position, motor 2914 is energized and clutch 2918 is engaged. Since the current provided to motor 2914 is constant, the resulting torque output by motor 2914 is likewise constant. As discussed above, however, the current output of constant current driver 2924 may be adjustable. As such, the torque output by motor 2914 is likewise adjustable and may be adjusted as desired to match the mechanical load placed on the particular axis of motion that motor 2914 is intended to power. Adjusting the torque is desirable in order enhance 20 safety and provide optimum performance. In the exemplary embodiment, the mechanical load may also be allowed to float, which is desirable when docking for example, or may be driven in either direction under control and with constant torque.

Optional limit switches 2920 and 2922 interrupt the current to motor 2914 when a limit of travel, such as up./down, clockwise/counterclockwise, in/out and side-to-side is reached. The interruption of current by the limit switched 2920 and/or 2922 prevents further motion in the direction of limit without affecting motion opposite to the direction of limit. For example, if the motor 2914 encounters a clockwise limit, counterclockwise motion of motor 2914 is not inhibited. This same principle holds true for all other axes of motion. If the limit switches are not installed, current is supplied directly from the selector 2910 the motor 2914 when selector 2910 is in a non-center position.

Figure 26:
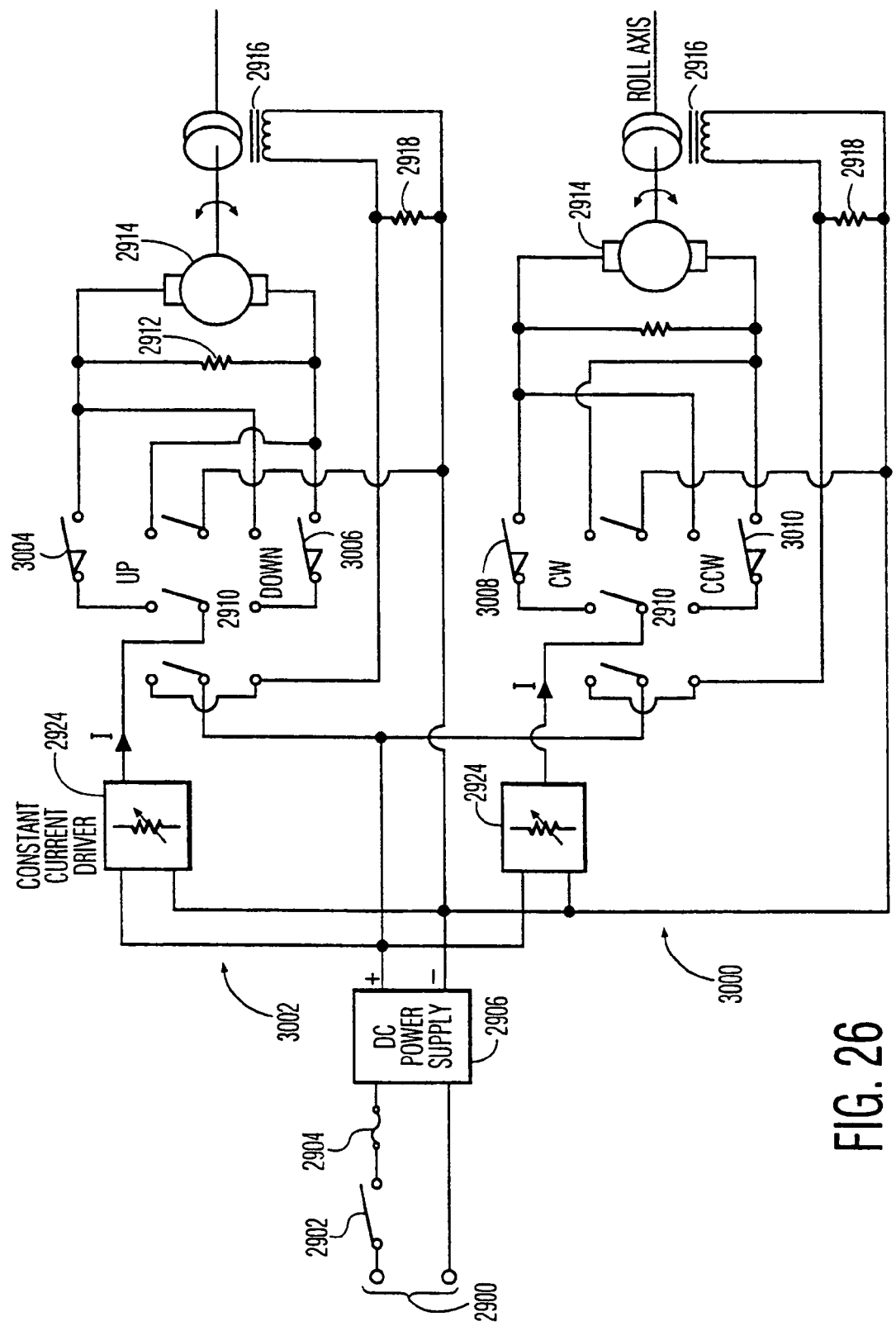
FIG. 26 is a simplified schematic of a dual axis control circuit.

FIG. 26 is a simplified schematic of a dual axis control circuit. In FIG. 26, the constant current driver 2924, selectors 2910, motors 2914, clutches 2916, optional limit switches (shown as 3004, 3006, 3008, 3010 in FIG. 26) and suppression circuits 2912, 2918 are duplicated. In the exemplary embodiment of FIG. 26, a first drive circuit 3000 provides rotational drive and a second drive circuit 3002 provides vertical drive, such as discussed with respect to FIGS. 20 and 23, respectively.

In the exemplary embodiment, the test head is maintained in a substantially weightless condition for easy and accurate positioning. A safety lock can be provided to maintain the test head at a given vertical position by fixing the main arm to the vertical guide rail 738. In view of the weight of the test head and/or counterweights, it is desirable that if the system becomes unbalanced while in a vertically locked condition that the main arm will remain locked if an operator attempts to release the lock.

Figure 27A:
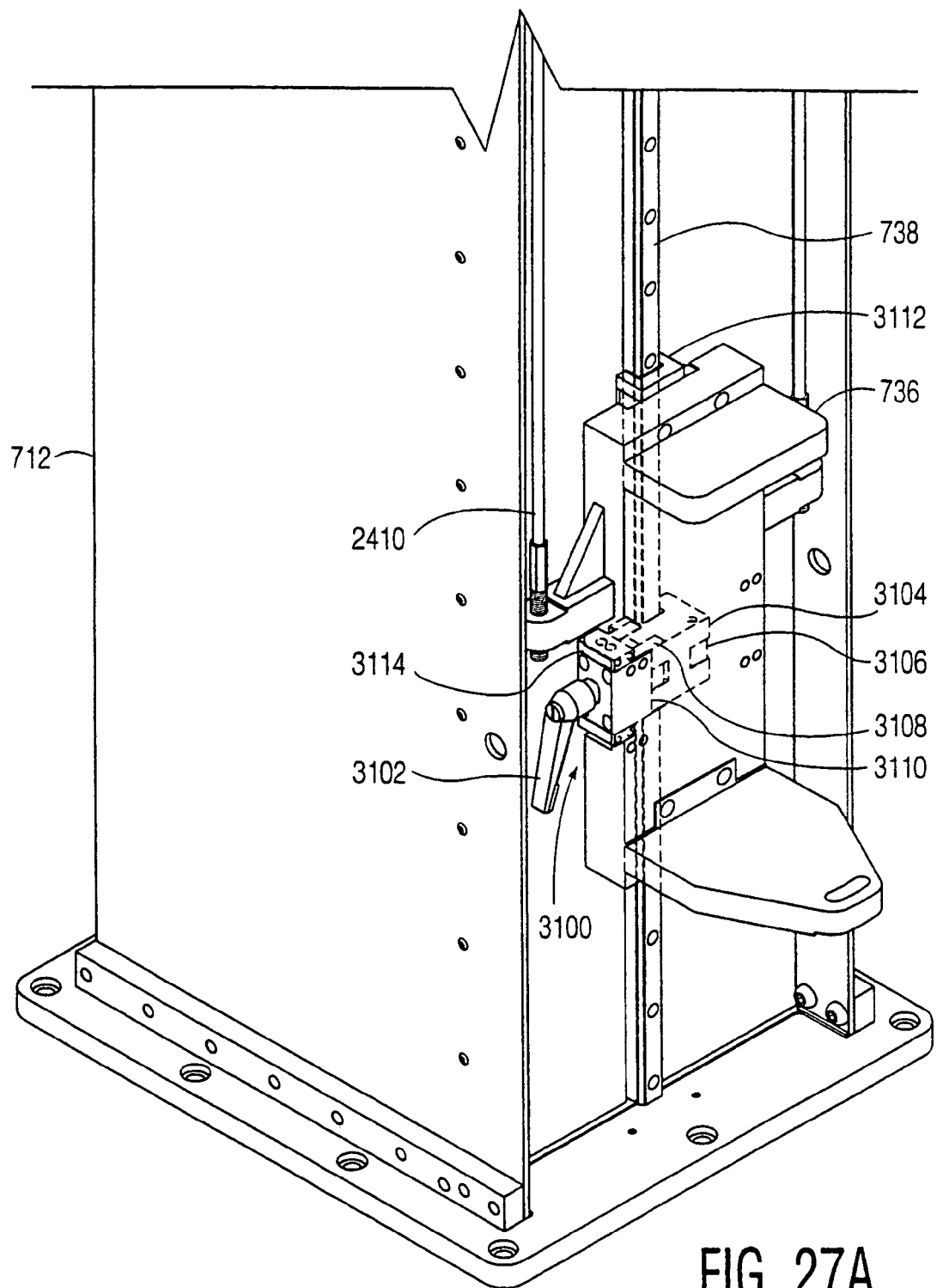
FIGS. 27A-27C of a lock system for the test head assembly.
Figure 27B:
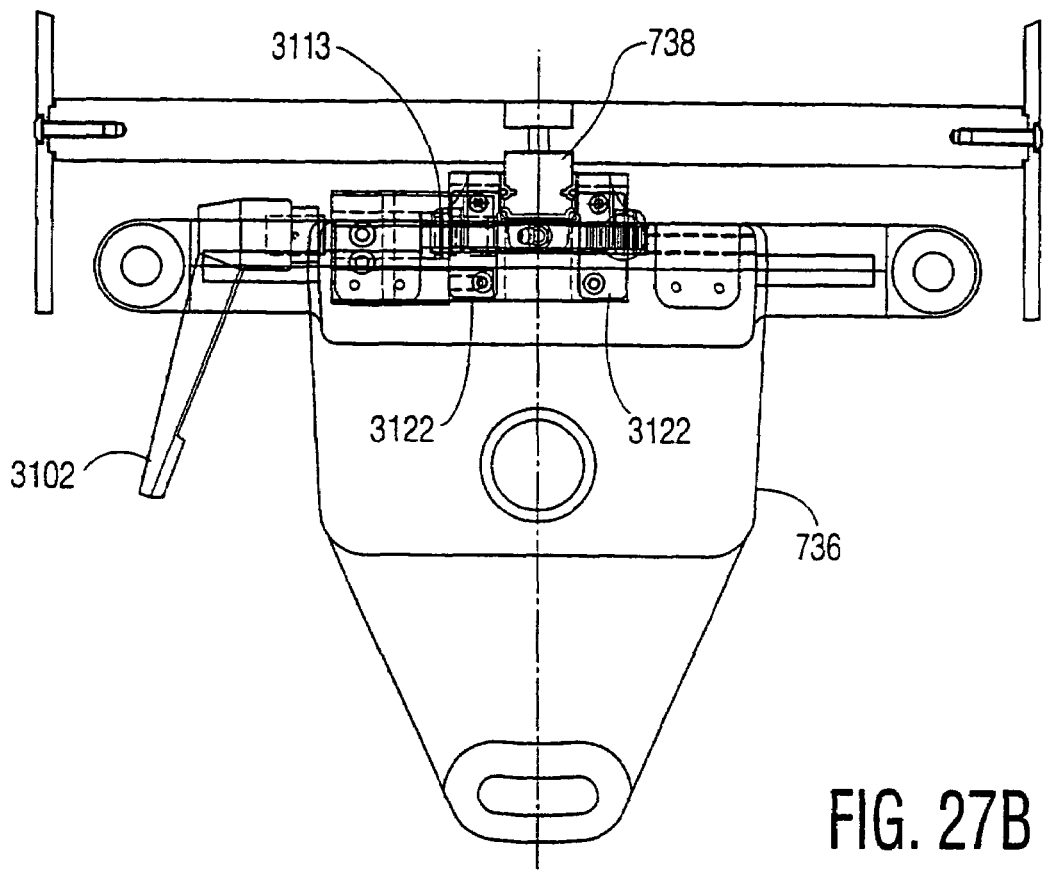
Figure 27C:
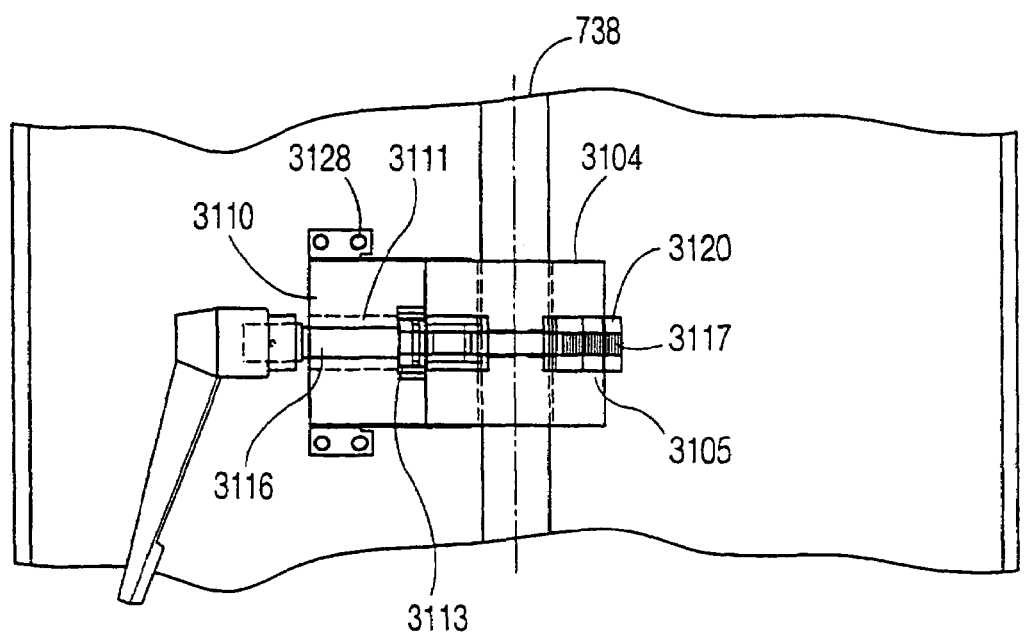

Referring now to FIGS. 27A-31, an exemplary lock system 3100 is shown. In FIGS. 27A-27C, the various views of lock system 3100 show its interrelationship with main arm 736 and vertical guide rail 738. Lock system 3100 is attached to a rear surface of main arm 736 with attaching means 3128, such as screws. Also attached to the rear surface of main arm 736 is slide 3112 allowing main arm 736 to move along vertical guide rail 738.

Lock system 3100 includes lock handle 3102 attached to one end of shaft 3116, safety block 3110 having a bore through which shaft 3116 passes, bearing 3113 connected to caliper 3122 and providing a bearing surface for shaft 3112 to rotate within along its longitudinal axis, lock block 3104 having a bore 3105 through which to which shaft 3116 passes, and a threaded cylinder 3120 that is treaded onto the other end of shaft 3116. The threads 3117 of shaft 3116 extend partially along the length of shaft 3116. Threaded cylinder 3120 fits within bore 3105 and, as shaft 3116 is rotated along its longitudinal axis by handle 3120, the distance between safety block 3110 and lock block 3104 will either increased or decreased depending on the rotation direction of shaft 3116.

For example, as shaft 3116 is rotated clockwise, safety block 3110 and lock block 3104 will move closer together forcing lock block 3104 to increase the pressure on the sides of vertical guide rail 738 as discussed in detail below. Conversely, as shaft 3116 is rotated counterclockwise, safety block 3110 and lock block 3104 will move further apart releasing the pressure applied to the sides of linear guide rail 738 by lock block 3104.

In the exemplary embodiment shaft 3116 lies in an axis orthogonal to the axis of linear guide rail 738 and lock handle 3120 ratchets so that rapid locking and unlocking using one hand may be achieved with minimal effort.

Figure 28A:
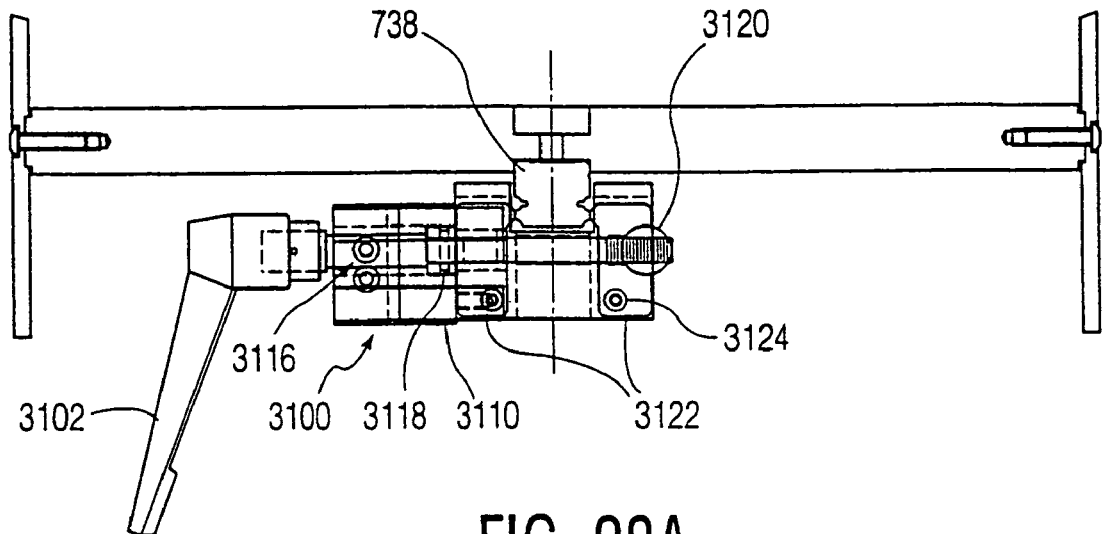
FIGS. 28A, 28B and 29 are illustrations of various detailed features of the lock shown in FIGS. 27A-27.
Figure 28B:
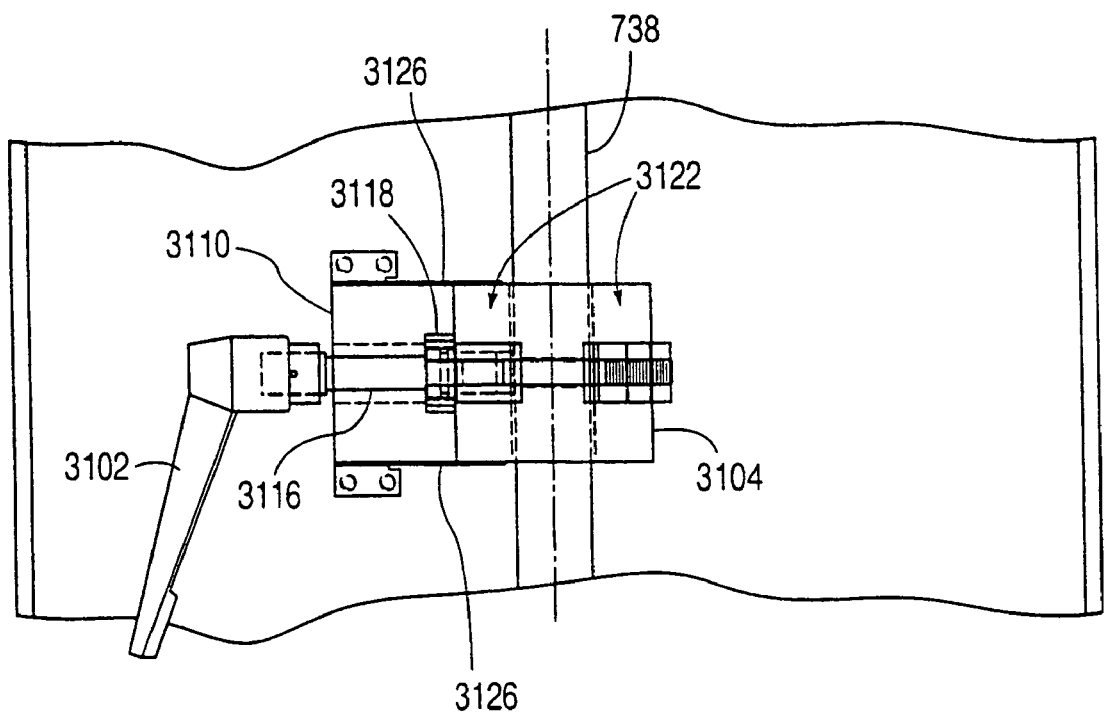
Figure 29:
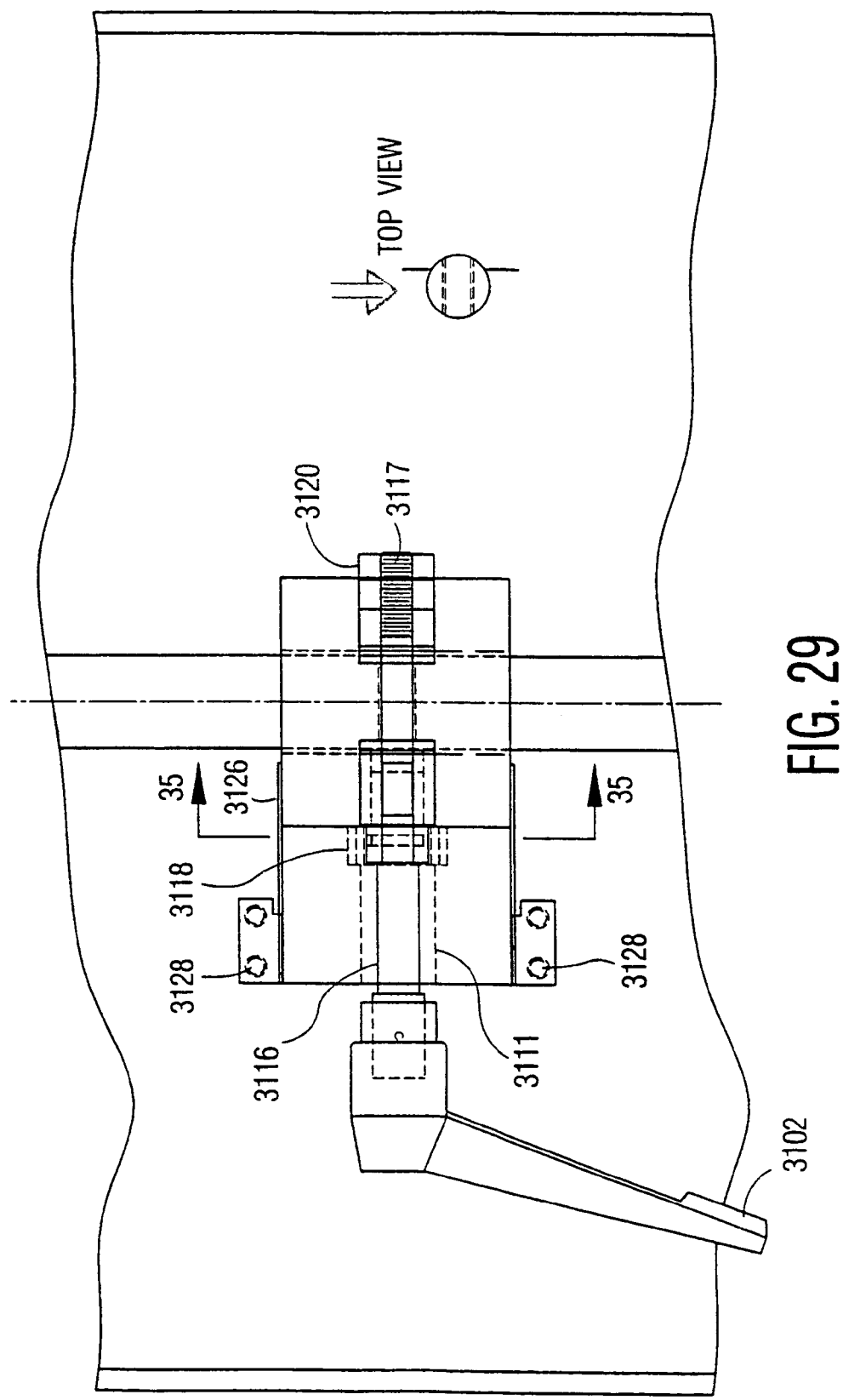

Referring now to FIGS. 28A, 28B and 29, details of lock system 3100 are shown. In FIG. 28A, lock block 3104 includes calipers 3122 attached at pivot points 3124. Each one of calipers 3122 are placed along opposite sides of linear guide rail 738, each having a clearance bore through which shaft 3116 passes. As shaft 3116 tightens against lock block 3104, the caliper 3122 adjacent safety block 3110 pivots, in a clockwise direction, as viewed from above, about pivot point 3124 and contacts vertical guide rail 738. Likewise, the caliper 3122 adjacent end block 3104 pivots in a counterclockwise direction, as viewed from above, about pivot point 3124 and contacts vertical guide rail 738. The combination of calipers 3122 pinching against vertical guide rail 738, locks main arm 736 to vertical guide rail 738.

Figure 30:
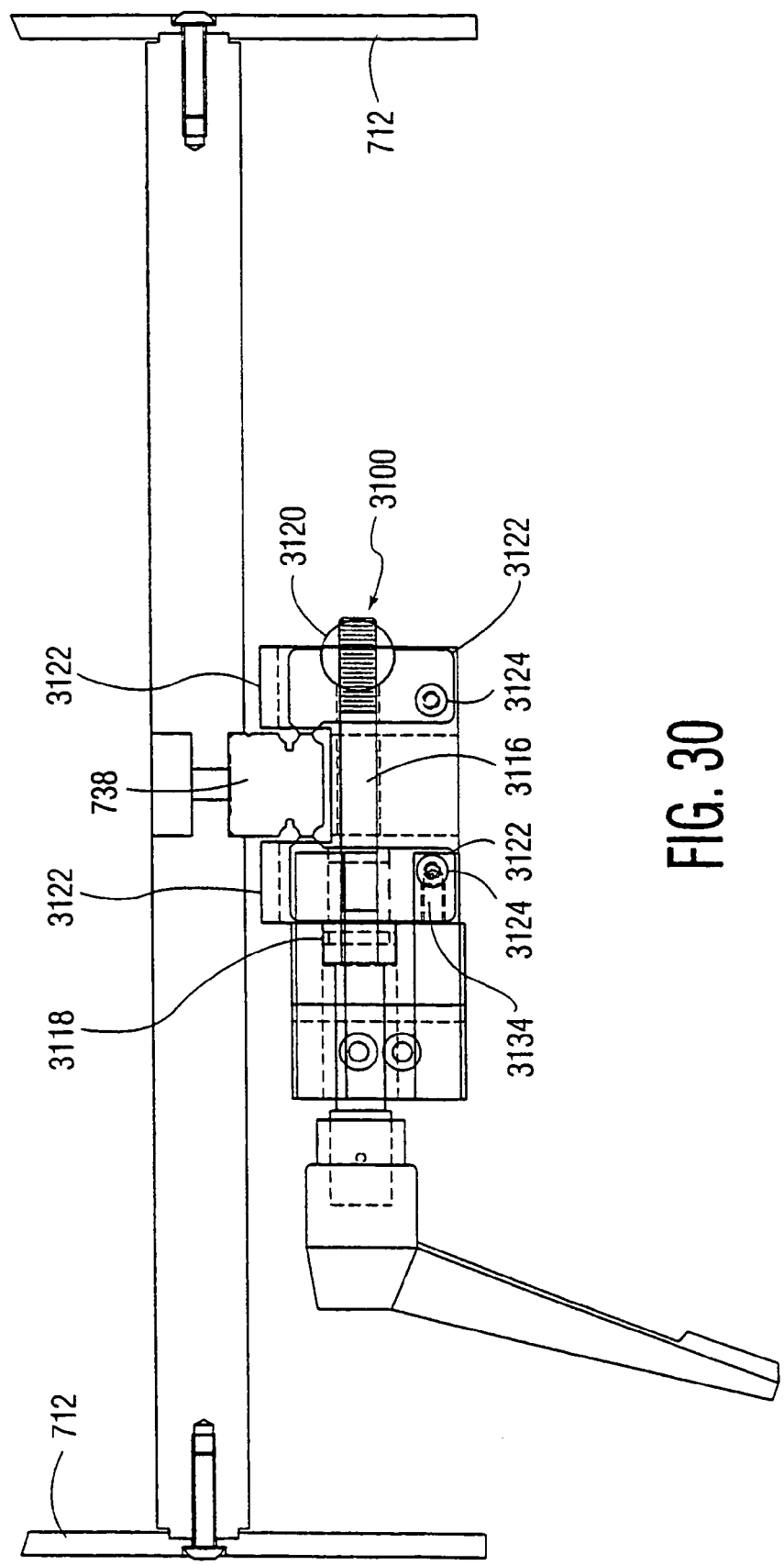
FIGS. 30 and 31 illustrate a fail-safe mechanism for the lock system shown in FIGS. 27A-27C.
Figure 31:
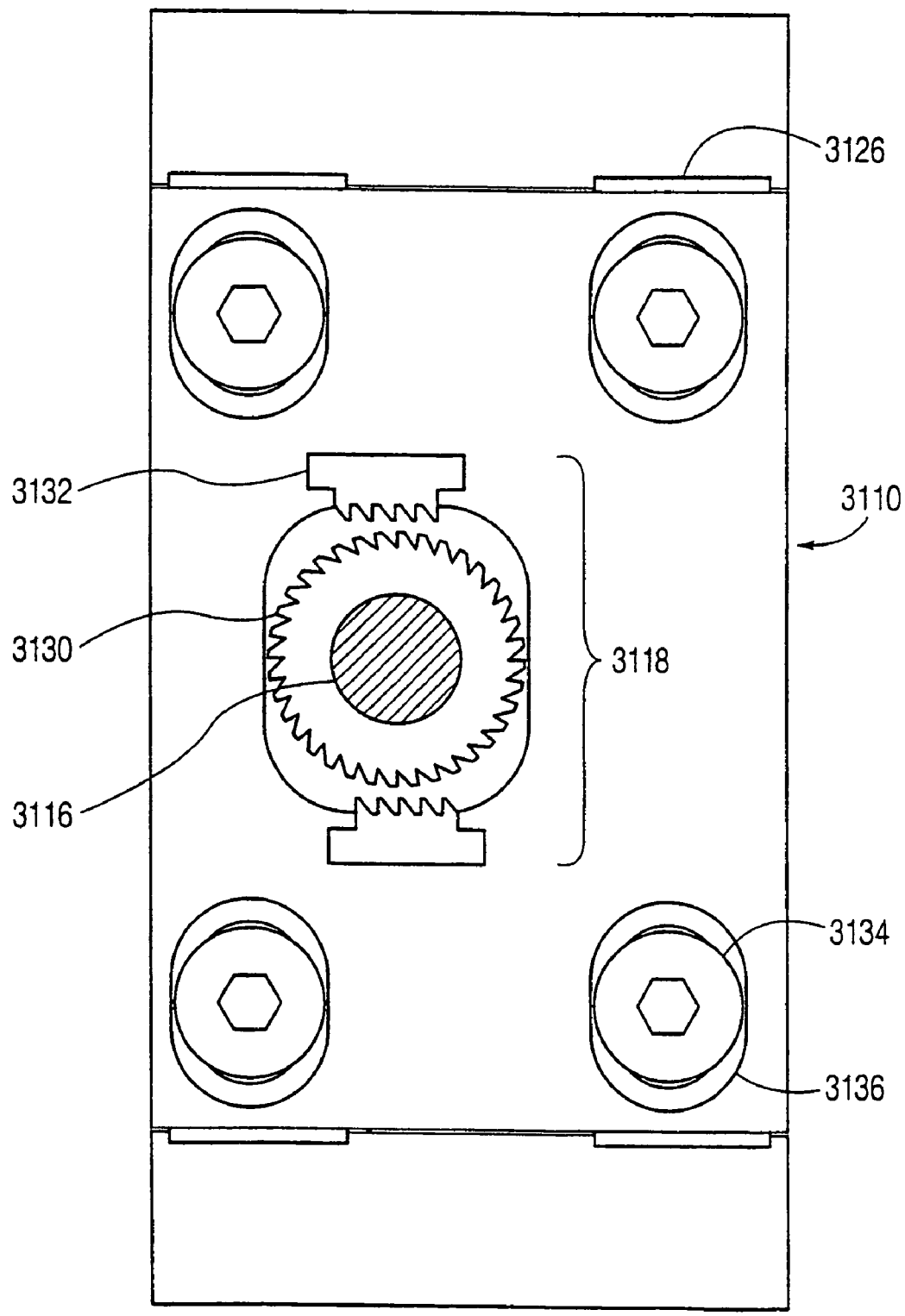

Referring now to FIGS. 30 and 31, a fail-safe mechanism for the safety lock 3100 is described. In FIG. 30, a pawl system 3130 is included in safety block 3110. As shown in greater detail in FIG. 31, pawl mechanism 3118 includes a gear 3130 attached to shaft 3116 and pawls 3132 installed in safety block 3110, above and below gear 3130. Slots 3136, such as elongated counter-bores, formed in safety block 3110, along with screws 3134, provide attachment of safety block 3110 to lock block 3104. In the exemplary embodiment slots 3136 are elongated counter-bores and screws 3134 are shoulder screws. Also attached to safety block 3110 are biasing springs 3126 that allow safety block 3110 to move vertically along slots 3136 relative to lock block 3104.

Under normal conditions, that is when is the test head is attached to the test head mount and the counterbalance (not shown) is attached to cable 2410, the weight of the test head and counterbalance compensate one another such that the screws 3134 are approximately centered in slot 3136 and neither pawl 3132 engages gear 3130, thereby allowing the operator to lock and unlock the main arm 736 at will. In the event that after the test head is locked in place by lock system 3100 the test head is removed, an attempt to unlock the main arm 736 may cause the main arm 736 to violently move upward causing possible injury to the operator and/or damage to the equipment. To avoid such a situation, upon removal of the test head, bias springs 3126 force safety block 3110 to move downward along the vertical axis, such that the upper pawl 3132 engages gear 3130, thereby preventing the operator from rotating shaft 3116 with handle 3102 to unlock the main arm 736. The operator, upon realizing that the test head was removed may remount the test head allowing the safety block to move back to the neutral position, once again allowing the main arm 736 to be unlocked from the vertical guide rail 738. Conversely, if either a counterbalance (not shown) is removed from cable 2410, or if cable 2410 breaks, bias springs 3126 would force safety block 3110 to move upward along the vertical axis, such that lower pawl 3132 engages gear 3130, thereby preventing the operator from rotating shaft 3116 with handle 3102 to unlock the main arm 736, again averting possible injury to the operator or damage to the test head.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. A system for positioning a load, comprising:
    an arm unit portion for moving said load in a same direction as a vertical axis;
    a motor drive having a driving portion for selectively driving said arm unit portion so that said load moves in the same direction as the vertical axis, said driving portion physically disengageable so that non-motorized motion of said load in the same direction as the vertical axis is possible when said motor drive is not in use, and
    a counterbalance coupled to said load and configured to substantially support said load when said driving portion is disengaged.

2. A system for positioning a load according to claim 1, wherein said motor drive provides constant torque when moving said load.

3. A system for positioning a load according to claim 2, wherein said constant torque is controlled to a value sufficient to move said load.

4. A system according to claim 3, wherein said motor is a DC motor, and said constant torque is controlled by controlling the current supplied to said DC motor.

5. A system for positioning a load according to claim 1, wherein said motor drive comprises an electric motor, a reduction gear train, and an electromagnetic clutch coupled to the arm unit portion of the system via a pulley and belt.

6. A system according to claim 5, wherein said clutch is a torque limiting slip clutch.

7. A system for positioning a load according to claim 1, wherein said motor drive comprises an electric motor, a reduction gear train, and an electromagnetic clutch coupled to the movable portion of the system via a friction drive roller.

8. A system for positioning a load according to claim 1, wherein said arm unit portion is also for moving said test head about said vertical axis.

9. A positioner for moving a test head into docking position with a device handler, said positioner comprising:
    an arm unit portion for moving said test head in a same direction as a vertical axis;
    a motor drive having a driving portion for selectively driving said arm unit portion so that said test head moves in the same direction as the vertical axis, said driving portion physically movable to disengage said driving portion so that rotation of said driving portion does not effect movement of said arm unit portion in the same direction as the vertical axis, and
    a counterbalance coupled to said test head and configured to substantially support said test head when said driving portion is disengaged.

10. A system for positioning a load according to claim 9, wherein said arm unit portion is also for moving said test head about said vertical axis.

* * * * *